(12) United States Patent
Coyne

(10) Patent No.: US 8,742,455 B2
(45) Date of Patent: Jun. 3, 2014

(54) APPARATUS FOR ELECTROSTATIC DISCHARGE PROTECTION

(75) Inventor: Edward Coyne, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 160 days.

(21) Appl. No.: 13/105,667

(22) Filed: May 11, 2011

(65) Prior Publication Data

US 2012/0286325 A1 Nov. 15, 2012

(51) Int. Cl.
*H01L 29/66* (2006.01)

(52) U.S. Cl.
USPC ............................................. 257/146

(58) Field of Classification Search
USPC .................................. 257/140, 146
See application file for complete search history.

(56) References Cited

U.S. PATENT DOCUMENTS

| | | | |
|---|---|---|---|
| 3,660,687 A | 5/1972 | Sahm et al. | |
| 3,694,670 A * | 9/1972 | Marzolf | 327/475 |
| 4,520,277 A * | 5/1985 | Hahn | 327/441 |
| 4,528,461 A * | 7/1985 | Shackle et al. | 327/471 |
| 4,992,844 A * | 2/1991 | Yakushiji | 257/140 |
| 5,235,201 A * | 8/1993 | Honna | 257/357 |
| 5,436,486 A * | 7/1995 | Fujishima et al. | 257/378 |
| 5,440,151 A * | 8/1995 | Crevel et al. | 257/173 |
| 5,473,169 A * | 12/1995 | Ker et al. | 257/173 |
| 5,485,023 A * | 1/1996 | Sumida | 257/139 |
| 5,594,266 A | 1/1997 | Beigel et al. | |
| 5,610,425 A * | 3/1997 | Quigley et al. | 257/358 |
| 5,637,892 A * | 6/1997 | Leach | 257/362 |
| 5,637,901 A | 6/1997 | Beigel et al. | |
| 5,663,860 A * | 9/1997 | Swonger | 361/56 |
| 5,736,769 A * | 4/1998 | Nishiura et al. | 257/368 |
| 5,862,301 A | 1/1999 | Gontowski, Jr. | |
| 5,892,264 A | 4/1999 | Davis et al. | |
| 5,949,094 A * | 9/1999 | Amerasekera | 257/173 |

(Continued)

FOREIGN PATENT DOCUMENTS

| | | |
|---|---|---|
| EP | 0 234 269 A2 | 9/1987 |
| EP | 2 246 885 A1 | 11/2010 |
| WO | WO 95/022842 | 8/1995 |
| WO | WO 97/10615 | 3/1997 |

OTHER PUBLICATIONS

Partial International Search Report mailed Dec. 8, 2010 for International application PCT/US2010/051356.

(Continued)

*Primary Examiner* — Yu-Hsi D Sun
*Assistant Examiner* — Grant Withers
(74) *Attorney, Agent, or Firm* — Knobbe, Martens, Olson & Bear LLP

(57) ABSTRACT

An apparatus includes an electrostatic discharge (ESD) protection device. In one embodiment, the protection device electrically coupled between a first node and a second node of an internal circuit to be protected from transient electrical events. The protection device includes a bipolar device or a silicon-controlled rectifier (SCR). The bipolar device or SCR can have a modified structure or additional circuitry to have a selected holding voltage and/or trigger voltage to provide protection over the internal circuit. The additional circuitry can include one or more resistors, one or more diodes, and/or a timer circuit to adjust the trigger and/or holding voltages of the bipolar device or SCR to a desired level. The protection device can provide protection over a transient voltage that ranges, for example, from about 100 V to 330V.

16 Claims, 20 Drawing Sheets

(56) References Cited

U.S. PATENT DOCUMENTS

| | | | | |
|---|---|---|---|---|
| 5,998,813 | A * | 12/1999 | Bernier | 257/175 |
| 6,690,557 | B2 * | 2/2004 | Hung et al. | 361/56 |
| 6,713,816 | B1 * | 3/2004 | Wolf et al. | 257/355 |
| 6,927,957 | B1 | 8/2005 | Bakulin et al. | |
| 7,471,493 | B1 * | 12/2008 | Huang et al. | 361/56 |
| 7,479,672 | B2 * | 1/2009 | Zhao | 257/256 |
| 7,859,082 | B2 | 12/2010 | Stecher | |
| 2005/0057866 | A1 * | 3/2005 | Mergens et al. | 361/56 |
| 2005/0111150 | A1 * | 5/2005 | Jang et al. | 361/56 |
| 2005/0280091 | A1 | 12/2005 | Huang et al. | |
| 2008/0218920 | A1 | 9/2008 | Vanysacker et al. | |
| 2009/0032837 | A1 | 2/2009 | Tseng et al. | |
| 2010/0027174 | A1 | 2/2010 | Galy et al. | |
| 2010/0059028 | A1 * | 3/2010 | Ueno | 123/652 |
| 2010/0109631 | A1 | 5/2010 | Vinson | |
| 2010/0171149 | A1 | 7/2010 | Denison et al. | |
| 2010/0321092 | A1 * | 12/2010 | Momota et al. | 327/512 |
| 2011/0101444 | A1 | 5/2011 | Coyne et al. | |
| 2011/0133246 | A1 * | 6/2011 | Ueno | 257/140 |
| 2012/0091503 | A1 * | 4/2012 | Su | 257/140 |
| 2012/0133025 | A1 | 5/2012 | Clarke et al. | |
| 2012/0175673 | A1 * | 7/2012 | Lee | 257/140 |
| 2012/0286396 | A1 * | 11/2012 | Coyne | 257/539 |

OTHER PUBLICATIONS

De Heyn et al "Design and Analysis of New Protection Structures for Smart Power Technology with Controlled Trigger and Holding Voltage" 2001 IEEE International Reliability Physics Symposium Proceedings 39th Annual, Orlando Florida, Apr. 30-May 3, 2001, IEEE International Reliability Physics Symposium, New York, NY, IEEE Apr. 30, 2001, pp. 253-258.

Gendron et al., "Deep Trench NPN Transistor for Low-RON EST Protection of High Voltage I/Os in Advance Smart Power Technology", Bipolar/Bicmos Circuits and Technology Meeting, IEEE, Oct. 1, 2006, pp. 1-4.

International Search Report for PCT/US2012/037028, mailed Jul. 20, 2012.

International Search Report for PCT/US2012/037154, mailed Jul. 25, 2012.

International Search Report for PCT/US2012/037160, mailed Oct. 10, 2012.

Invitation to Pay Additional Fees for PCT/US2012/037160, mailed Jul. 23, 2012.

Urresti et al., "Lateral Punch-Through TVS Devices for On-Chip Protection in Low-Voltage Applications", Microelectronics and Reliability, Elsevier Science LTD, vol. 45, No. 7-8, Jul. 1, 2005, pp. 1181-1186.

Walker et al., "Novel Robust High Voltage ESD Clamps for LDMOS Protection", Physics Symposium, 2007, IEEE International, Apr. 1, 2007, pp. 596-597.

* cited by examiner

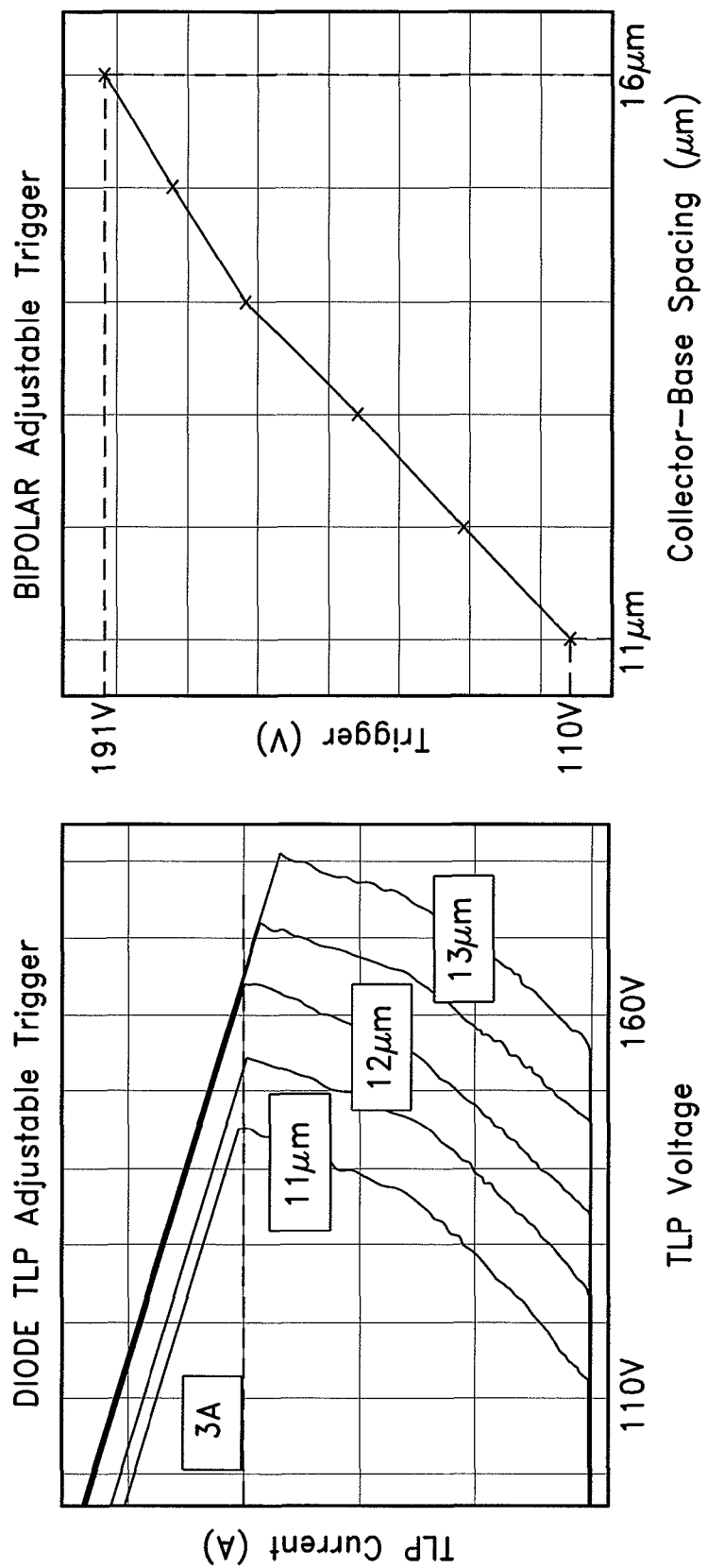

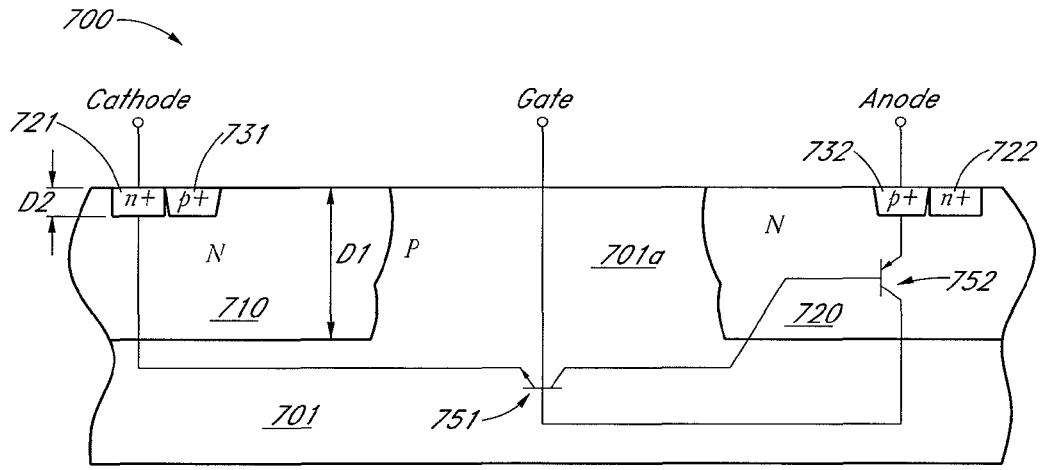
FIG. 7A
(PRIOR ART)
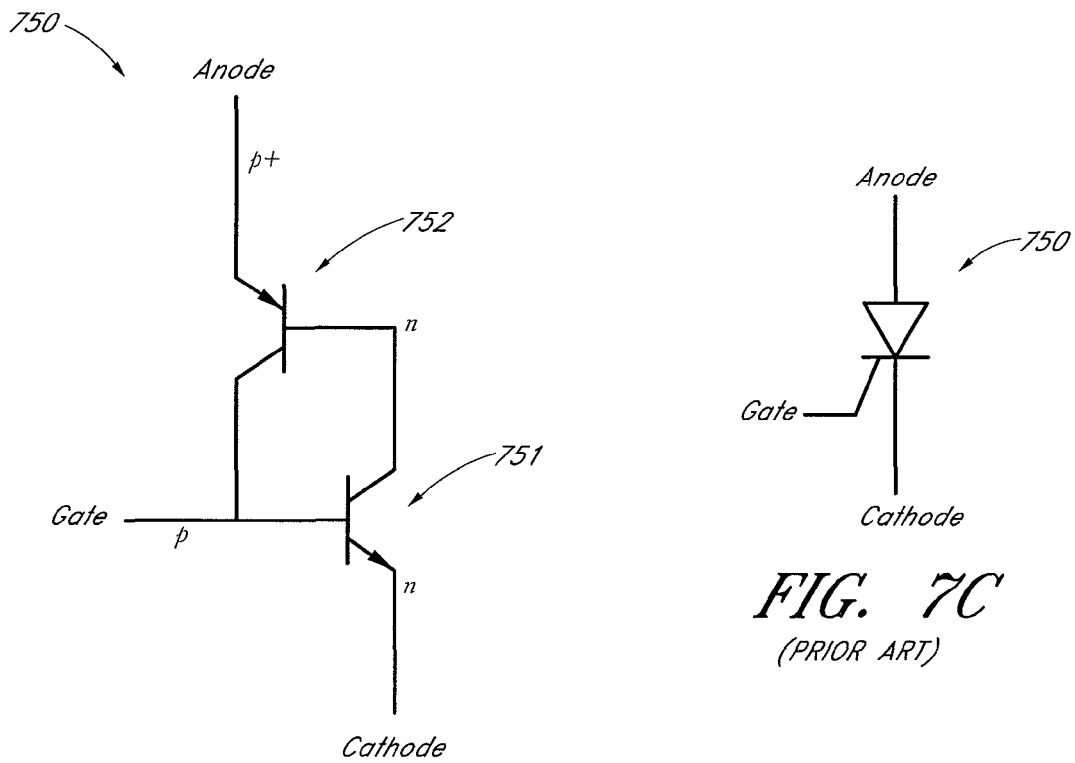
FIG. 7B
(PRIOR ART)
FIG. 7C
(PRIOR ART)

US 8,742,455 B2

APPARATUS FOR ELECTROSTATIC DISCHARGE PROTECTION

CROSS-REFERENCE TO RELATED APPLICATIONS

This application is related to copending application titled APPARATUS FOR ELECTROSTATIC DISCHARGE PROTECTION (Inventor: Edward Coyne; Ser. No. 13/105,622, filed on the same date as the present application), the disclosure of which is hereby incorporated by reference in its entirety.

BACKGROUND

1. Field

Embodiments of the invention relate to electronic devices, and more particularly, in one or more embodiments, to electrostatic discharge protection.

2. Description of the Related Technology

Electronic systems can be exposed to a transient electrical event, or an electrical signal of a relatively short duration having rapidly changing voltage and high power. Transient electrical events can include, for example, electrostatic discharge (ESD) events arising from the abrupt release of charge from an object or person to an electronic system.

Transient electrical events can destroy an integrated circuit (IC) inside an electronic system due to overvoltage conditions and high levels of power dissipation over relatively small areas of the IC. High power dissipation can increase IC temperature, and can lead to numerous problems, such as gate oxide punch-through, junction damage, metal damage, and surface charge accumulation. Moreover, transient electrical events can induce latch-up (inadvertent creation of a low-impedance path), thereby disrupting the functioning of the IC and potentially causing permanent damage to the IC from self-heating in the latch-up current path. Thus, there is a need to provide an IC with protection from such transient electrical events.

SUMMARY

In one embodiment, an apparatus includes: an internal circuit electrically coupled between a first node and a second node; and a protection device electrically coupled between the first node and the second node. The protection device is configured to protect the internal circuit from transient electrical events. The protection device includes: a buried layer 510 having a doping of a first type; a first plug 540 overlying the buried layer, and having a doping of the first type with a higher doping concentration than that of the buried layer, the first plug having an annular shape when viewed from above from the protection device; a first well 520 overlying the buried layer, and laterally surrounded by the first plug, the first well having a doping of the first type with a lower doping concentration than that of the first plug; a second plug 530 laterally surrounding the first plug, the second plug having a doping of a second type different from the first type; a first region 550 disposed at least in an end portion of the first well 520 opposite the buried layer, and electrically coupled to the first node, the first region having a doping of the second type with a higher doping concentration than that of the second plug 530; a second region 560 disposed in a top portion of the second plug 530, and electrically coupled to the second node, the second region having a doping of the second type with a higher doping concentration than that of the second plug; and a resistor electrically coupled between the first region 550 and the first plug 540, wherein the resistor is disposed outside the first region and the first plug.

In another embodiment, an apparatus includes: an internal circuit electrically coupled between a first node and a second node; and a protection device electrically coupled between the first node and the second node, wherein the protection device is configured to protect the internal circuit from transient electrical events. The protection device includes: a buried layer having a doping of a first type; a first plug disposed directly over the buried layer, and having a doping of the first type with a higher doping concentration than that of the buried layer, the first plug having an annular shape when viewed from above; a first well disposed directly over the buried layer, and laterally surrounded by the first plug, the first well having a doping of the first type with a lower doping concentration than that of the first plug; a second plug laterally surrounding the first plug, the second plug having a doping of a second type different from the first type; a first region disposed at least in an end portion of the first well 520 opposite the buried layer, and electrically coupled to the first node, the first region having a doping of the second type with a higher doping concentration than that of the second plug; and a second region disposed in a top portion of the second plug, and electrically coupled to the second node, the second region having a doping of the second type with a higher doping concentration than that of the second plug.

In yet another embodiment, an apparatus includes: an internal circuit electrically coupled between a first node and a second node; and a protection device electrically coupled between the first node and the second node, wherein the protection device is configured to protect the internal circuit from transient electrical events. The protection device includes: a buried layer having a doping of a first type; a first plug overlying the buried layer, and having a doping of the first type with a higher doping concentration than that of the buried layer, the first plug having an annular shape when viewed from above; a first well overlying the buried layer, and laterally surrounded by the first plug, the first well having a doping of the first type with a lower doping concentration than that of the first plug; a second plug laterally surrounding the first plug, the second plug having a doping of a second type different from the first type; a first region disposed in a top portion of the first well and electrically coupled to the first node, the first region having a doping of the second type with a higher doping concentration than that of the second plug; a second region disposed in a top portion of the second plug, and electrically coupled to the second node, the second region having a doping of the second type with a higher doping concentration than that of the second plug; and a diode array comprising one or more diodes connected in series between the first plug and the second region.

In yet another embodiment, an apparatus includes: an internal circuit electrically coupled between a first node and a second node; and a protection device electrically coupled between the first node and the second node, wherein the protection device is configured to protect the internal circuit from transient electrical events. The protection device includes: a buried layer having a doping of a first type; a first plug overlying the buried layer, and having a doping of the first type with a higher doping concentration than that of the buried layer, the first plug having an annular shape when viewed from above; a first well overlying the buried layer, and laterally surrounded by the first plug, the first well having a doping of the first type with a lower doping concentration than that of the first plug; a second plug laterally surrounding the first plug, the second plug having a doping of a second type different from the first type; a first region disposed in a top portion of the first well and electrically coupled to the first node, the first region having a doping of the second type with a higher doping concentration than that of the second plug, wherein the first region disposed in a top portion of the first well and at least in a portion of a top portion of the first plug; and a second region disposed in a top portion of the second plug, and electrically coupled to the second node, the second region having a doping of the second type with a higher doping concentration than that of the second plug.

In yet another embodiment, an apparatus includes: an internal circuit electrically coupled between a first node and a second node; and a protection device electrically coupled between the first node and the second node, wherein the protection device is configured to protect the internal circuit from transient electrical events. The protection device includes: a buried layer having a doping of a first type; a first plug overlying the buried layer, and having a doping of the first type with a higher doping concentration than that of the buried layer, the first plug having an annular shape when viewed from above; a first well overlying the buried layer, and laterally surrounded by the first plug, the first well having a doping of the first type with a lower doping concentration than that of the first plug; a second plug laterally surrounding the first plug, the second plug having a doping of a second type different from the first type; a first region disposed in a top portion of the first well, the first region having a doping of the second type with a higher doping concentration than that of the second plug; and a second region disposed in a top portion of the second plug, and electrically coupled to the second node, the second region having a doping of the second type with a higher doping concentration than that of the second plug; a first resistor electrically coupled between the first region and the first node; and a second resistor electrically coupled to the first plug.

In yet another embodiment, an apparatus includes: an internal circuit electrically coupled between a first node and a second node; and a protection device electrically coupled between the first node and the second node, wherein the protection device is configured to protect the internal circuit from transient electrical events. The protection device includes: a silicon-controlled rectifier (SCR) having an anode, a gate, and a cathode, wherein the anode is electrically coupled to the first node, and the cathode is electrically coupled to the second node; and a diode array comprising a plurality of diodes connected in series between the gate and the anode of the silicon-controlled rectifier and arranged such that the diodes conduct a current into the SCR to turn on the SCR when the diodes break down.

In yet another embodiment, an apparatus includes: an internal circuit electrically coupled between a first node and a second node; and a protection device electrically coupled between the first node and the second node, wherein the protection device is configured to protect the internal circuit from transient electrical events. The protection device includes: a silicon-controlled rectifier (SCR) having an anode, a gate, and a cathode, wherein the anode is electrically coupled to the first node, and the cathode is electrically coupled to the second node; and a resistor electrically coupled between the gate and the cathode of the SCR.

In yet another embodiment, an apparatus includes: an internal circuit electrically coupled between a first node and a second node; and a protection device electrically coupled between the first node and the second node, wherein the protection device is configured to protect the internal circuit from transient electrical events. The protection device includes a silicon-controlled rectifier (SCR) having an anode, a gate, and a cathode, wherein the anode is electrically coupled to the first node, and the cathode is electrically coupled to the second node. The SCR includes: a substrate having a doping of a first type; a first well disposed in a first upper portion of the substrate, and having a doping of a second type different from the first type; a second well disposed in a second upper portion of the substrate, and spaced apart laterally from the first well such that a third upper portion of the substrate is laterally interposed between the first and second wells, the second well having a doping of the second type, the third upper portion having a doping of the first type; a first region disposed in a top portion of the first well, and having a doping of the second type with a higher doping concentration than that of the first well, the first region being electrically coupled to the second node; a second region disposed in a top portion of the second well, and having a doping of the second type with a higher doping concentration than that of the second well; a third region disposed in the first well adjacent to the first region such that the third region is interposed laterally between the first region and the third upper portion of the substrate, the third region having a doping of the first type with a higher doping concentration than that of the substrate; a fourth region disposed in the second well adjacent to the second region such that the fourth region is interposed laterally between the second region and the third upper portion of the substrate, the fourth region having a doping of the first type with a higher doping concentration than that of the substrate, the fourth region being electrically coupled to the first node; and a gate contact disposed on the third upper portion of the substrate. The third region has a lateral dimension extending in a direction from the first region toward the third upper portion of the substrate, and the lateral dimension of the third region is greater than the lateral dimension of the first region in the direction.

In yet another embodiment, an apparatus includes: an internal circuit electrically coupled between a first node and a second node; and a protection device electrically coupled between the first node and the second node, wherein the protection device is configured to protect the internal circuit from transient electrical events. The protection device includes: a silicon-controlled rectifier (SCR) having an anode, a gate, and a cathode, wherein the anode is electrically coupled to the first node; a first resistor electrically coupled between the cathode of the SCR and the second node; and a second resistor electrically coupled to the gate of the SCR.

In yet another embodiment, an apparatus includes: an internal circuit electrically coupled between a first node and a second node; and a protection device electrically coupled between the first node and the second node, wherein the protection device is configured to protect the internal circuit from transient electrical events. The protection device includes: a bipolar device having a first terminal, a second terminal, and a third terminal, wherein the first terminal is electrically coupled to the first node, and the third terminal is electrically coupled to the second node; an impedance block electrically coupled between the second terminal of the bipolar device and a first voltage reference, wherein the impedance block is configured to have a varying impedance; and an impedance control circuit configured to vary the impedance of the impedance block.

BRIEF DESCRIPTION OF THE DRAWINGS

FIG. 6A is a graph showing a relationship between transmission line pulse (TLP) voltage and TLP current of an ESD protection device having a diode TLP adjustable trigger mechanism.

FIG. 6B is a graph showing a relationship between collector-base spacing and trigger voltage of an ESD protection device having a bipolar TLP adjustable trigger mechanism.

FIG. 7A is a cross-section of a conventional silicon-controlled rectifier (SCR) ESD protection device.

FIG. 7B is a circuit diagram of the conventional SCR ESD protection device of FIG. 6A.

FIG. 7C is a symbol of the conventional SCR ESD protection device of FIG. 6A.

DETAILED DESCRIPTION OF EMBODIMENTS

Figure 1:
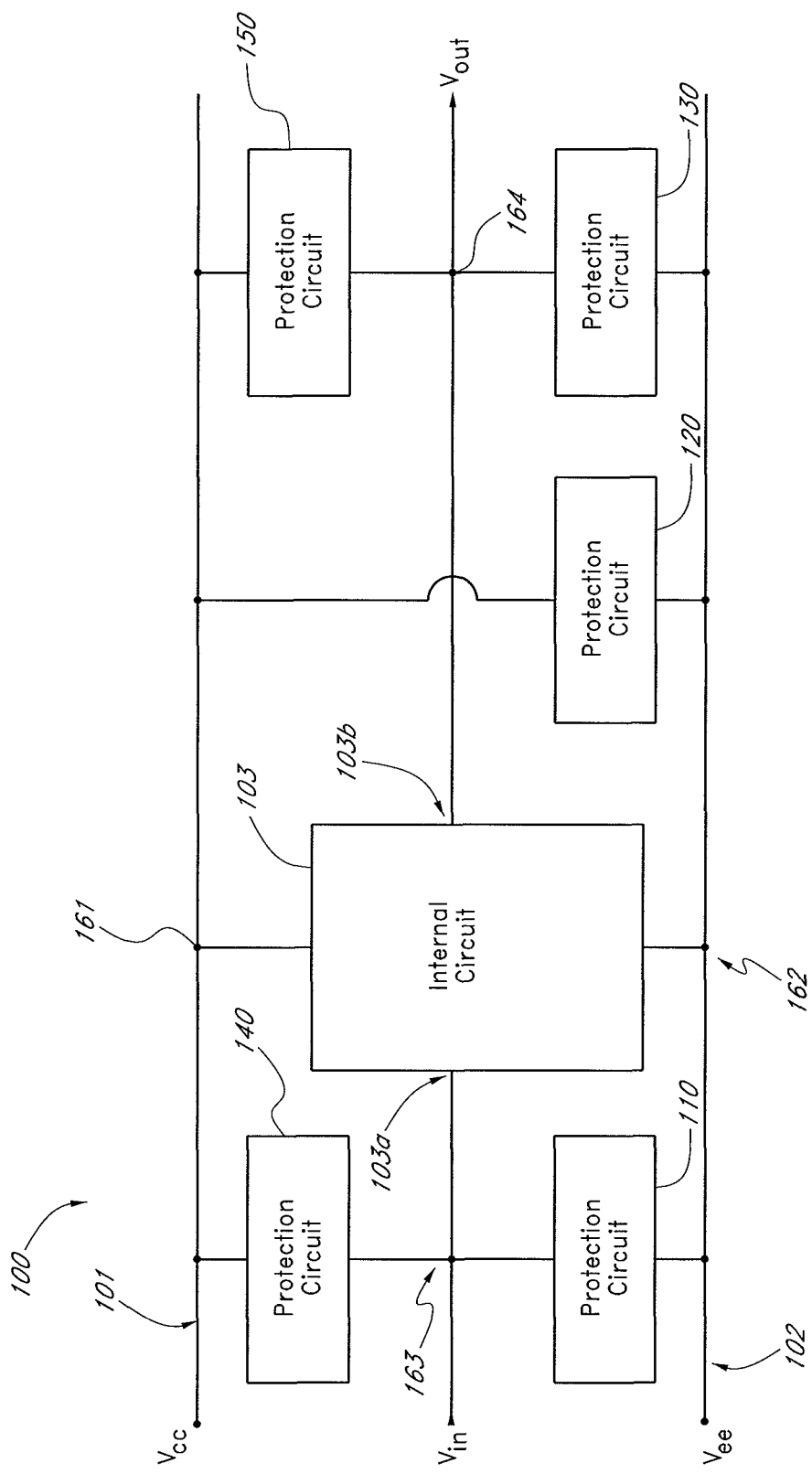
FIG. 1 is a schematic block diagram of an electronic system including an internal circuit and ESD protection circuits according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Terms such as above, below, over and so on as used herein refer to a device orientated as shown in the figures and should be construed accordingly. It should also be appreciated that because regions within a semiconductor device (such as a transistor) are defined by doping different parts of a semiconductor material with differing impurities or differing concentrations of impurities, discrete physical boundaries between different regions may not actually exist in the completed device but instead regions may gradually transition from one to another. Some boundaries as shown in the accompanying figures are of this type and are illustrated as abrupt structures merely for the assistance of the reader. In the embodiments described below, p-type regions can include a p-type semiconductor material, such as boron, as a dopant. Further, n-type regions can include an n-type semiconductor material, such as phosphorous, as a dopant. A skilled artisan will appreciate various concentrations of dopants in regions described below.

In all the embodiments described in this document, a region, a layer, or a well denoted with "N" or "n" can contain n-type dopants, and a region, a layer, or a well denoted with "P" or "p" can contain p-type dopants unless otherwise indicated. Further, "N+," "n+," "P+," and "p+" indicate a higher doping concentration than "N," "n," "P," and "p," respectively. Also, "n," "N," "p," and "P" indicate a higher doping concentration than "n−," "N−," "p−," and "P−," respectively.

In the embodiments described in this document, the term "overlying" is similar in meaning to "being disposed over." When a first layer overlies a second layer, the first layer is positioned above the second layer, and can contact directly or indirectly the second layer unless otherwise specified. When a first layer is directly over a second layer, the lower surface of the first layer contacts to the top surface of the second layer.

Overview of Electrostatic Discharge Protection

Referring to FIG. 1, an electronic device including an internal circuit and protection circuits according to one embodiment will be described below. The illustrated electronic device 100 includes a first power supply rail 101, a second power supply rail 102, an internal circuit 103, first to fifth protection circuits 110-150, and first to fourth nodes 161-164. The third node 163 can also be referred to as an "input node." The fourth node 164 can also be referred to as an "output node."

In one embodiment, the protection circuits 110-150 are integrated with the internal circuit 103 in a common semiconductor substrate for system-on-a-chip applications. In other embodiments, one or more of the protection circuits 110-150 can be placed in a stand-alone IC, in a common package for system-on-a-package applications, and electrically coupled to the internal circuit 103.

The first power supply rail 101 is electrically coupled to a first voltage source Vcc, and the second power supply rail 102 is electrically coupled to a second voltage source Vee. In one embodiment, the first voltage source Vcc can provide a voltage between about 0 V and about 300 V, for example, about 250 V. The second voltage source Vee can provide a voltage between about −300 V and about 0 V, for example, 0 V.

The internal circuit 103 is electrically coupled to the first and second power supply rails 101, 102 at the first and second nodes 161, 162, respectively, to receive power. The internal circuit 103 can include one or more integrated circuits (ICs) of any configuration and function, which use electrostatic discharge protection. The internal circuit 103 can include an input 103a electrically coupled to the third node 163, and an output 103b electrically coupled to the fourth node 164. In some embodiments, the electronic device can also include a resistor between the third node 163 and the input 103a, and/or between the fourth node 164 and the output 103b to reduce a current flow to the internal circuit 103 during an ESD event. The internal circuit 103 can receive an input voltage signal $V_{IN}$ at the input 103a, and output an output voltage signal $V_{OUT}$ at the output 103b.

In the illustrated embodiment, the first protection circuit 110 has a first terminal electrically coupled to the third node 163, and a second terminal electrically coupled to the second node 162. The first protection circuit 110 can serve to protect the third node 163 coupled to the input 103a of the internal circuit 103 from an ESD event occurring between the third node 163 and the second power supply rail 102 (or some other node or pad coupled to the internal circuit 103), which has a voltage exceeding that of the first power supply rail 101.

The second protection circuit 120 has a first terminal electrically coupled to the first node 161, and a second terminal electrically coupled to the second node 162. The second protection circuit 120 can serve to protect the internal circuit 103 from an ESD event occurring between the first and second power supply rail 101, 102.

The third protection circuit 130 has a first terminal electrically coupled to the fourth node 164, and a second terminal electrically coupled to the second node 162. The third protection circuit 130 can serve to protect the fourth node 164 coupled to the output 103b of the internal circuit 103 from an ESD event occurring between the fourth node 164 and the second power supply rail 102 (or some other node or pad coupled to the internal circuit 103), which has a voltage exceeding that of the first power supply rail 101.

The fourth protection circuit 140 has a first terminal electrically coupled to the first node 161, and a second terminal electrically coupled to the third node 163. The fourth protection circuit 140 can serve to protect the third node 163 from an ESD event occurring between the third node 163 and the first power supply rail 101 (or some other node or pad coupled to the internal circuit 103), which has a voltage exceeding that of the first power supply rail 101.

The fifth protection circuit 150 has a first terminal electrically coupled to the first node 161, and a second terminal electrically coupled to the fourth node 164. The fifth protection circuit 150 can serve to protect the fourth node 164 from an ESD event occurring between the fourth node 164 and the first power supply rail 101 (or some other node or pad coupled to the internal circuit 103), which has a voltage exceeding that of the first power supply rail 101.

Figure 2:
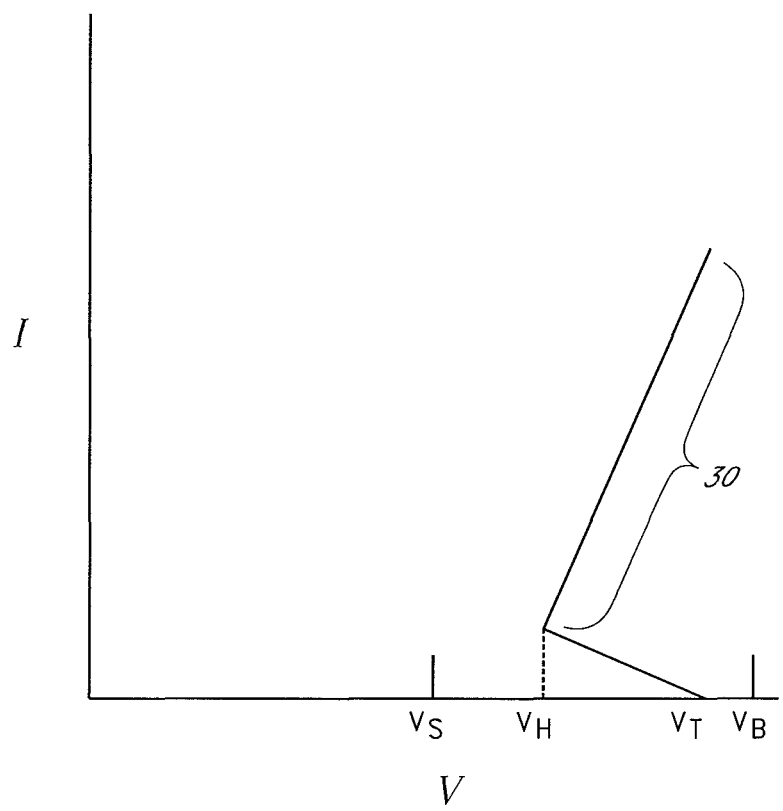
FIG. 2 is a graph illustrating a relationship between output current and input voltage of an example ESD protection device.

In some embodiments, a protection circuit can have current-voltage characteristics as shown in FIG. 2. Ideally, the protection circuit does not pass any current until a trigger voltage $V_T$ is reached. The trigger voltage $V_T$ should be less than a breakdown voltage $V_B$ for an internal circuit being protected. Once the trigger voltage $V_T$ is reached, the protection circuit starts conducting a current, and the voltage across the protection circuit falls back to a holding voltage $V_H$ that is lower in magnitude than the trigger voltage $V_T$. From the holding voltage $V_H$, ideally an increase in current flow would occur without an increase in the voltage across the protection circuit. Practically, however, due to resistance within the protection circuit, the voltage across the protection circuit can increase slightly as the current flow increases in the region 30.

The holding voltage $V_H$ should be above (in magnitude) the power supply rail voltage (for example, Vcc in FIG. 1) by, for example, at least about 4 or 5 V, (alternatively, about 10% higher than the power supply rail voltage) in order to accommodate temperature and process variations. Otherwise, once the protection circuit is triggered, it might not reset to a non-conducting state. After the voltage across the protection circuit decreases below the holding voltage $V_H$, the protection circuit can reset by itself, thereby returning to a high impedance state. A skilled artisan will appreciate that the characteristic of a protection circuit can vary widely, depending on the configuration of the internal circuit 103.

ESD Protection Device with Multi-Range ESD Protection

Figure 3:
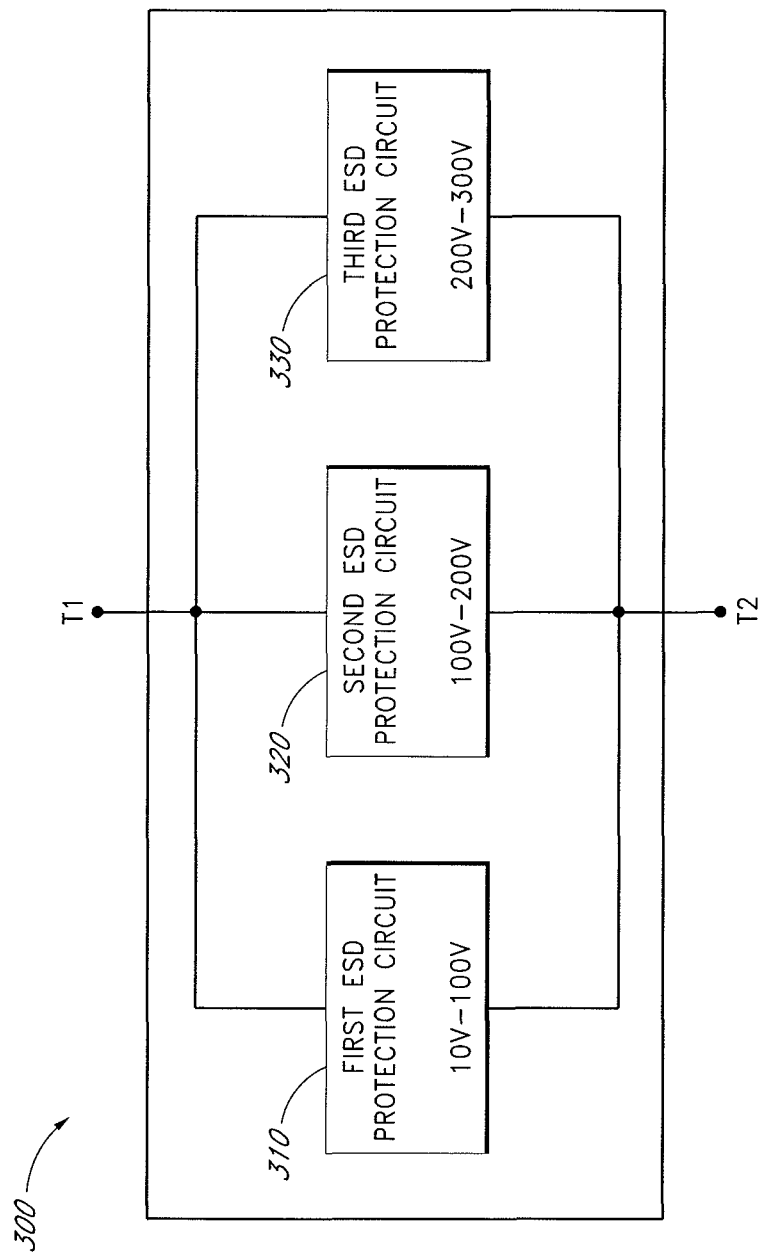
FIG. 3 is a block diagram of an ESD protection circuit according to one embodiment.

Referring to FIG. 3, one embodiment of an electrostatic discharge (ESD) protection device will be described below. The illustrated protection device 300 can include a first ESD protection circuit 310, a second ESD protection circuit 320, and a third ESD protection circuit 330. The protection circuits 310-330 are electrically coupled in parallel between a first terminal T1 and a second terminal T2.

The illustrated protection device 300 can form, for example, any of the protection circuits 110-150 of FIG. 1. The first and second terminals T1, T2 can be two of the nodes 161, 162, 163, 164 of FIG. 1 to which the protection device is coupled to provide ESD protection over the internal circuit 103 of FIG. 1.

In one embodiment, the first ESD protection circuit 310 can provide ESD protection over a low voltage range, for example, a range from about 10 V to 100 V, and the second ESD protection circuit 320 can provide ESD protection over an intermediate voltage range, for example, a range from about 100 V to 200 V. The third ESD protection circuit 330 can provide ESD protection over a high voltage range, for example, a range from about 200 V to 330 V. In other embodiments, the ranges of voltage of the protection circuits 310-330 can vary widely, depending on the circuits 310-330. In some embodiments, one or two of the circuits 310-330 are included in the protection device 300. Other numbers of circuits will be readily determined by one of ordinary skill in the art.

In one embodiment, an ESD protection device can have a bipolar device configuration, as will be described in connection with FIG. 4-6D or 12. In other embodiments, an ESD protection device can have a silicon-controlled rectifier configuration, as will be described in connection with FIGS. 7A-11B.

ESD Protection Device with Bipolar Device Configuration

Figure 4A:
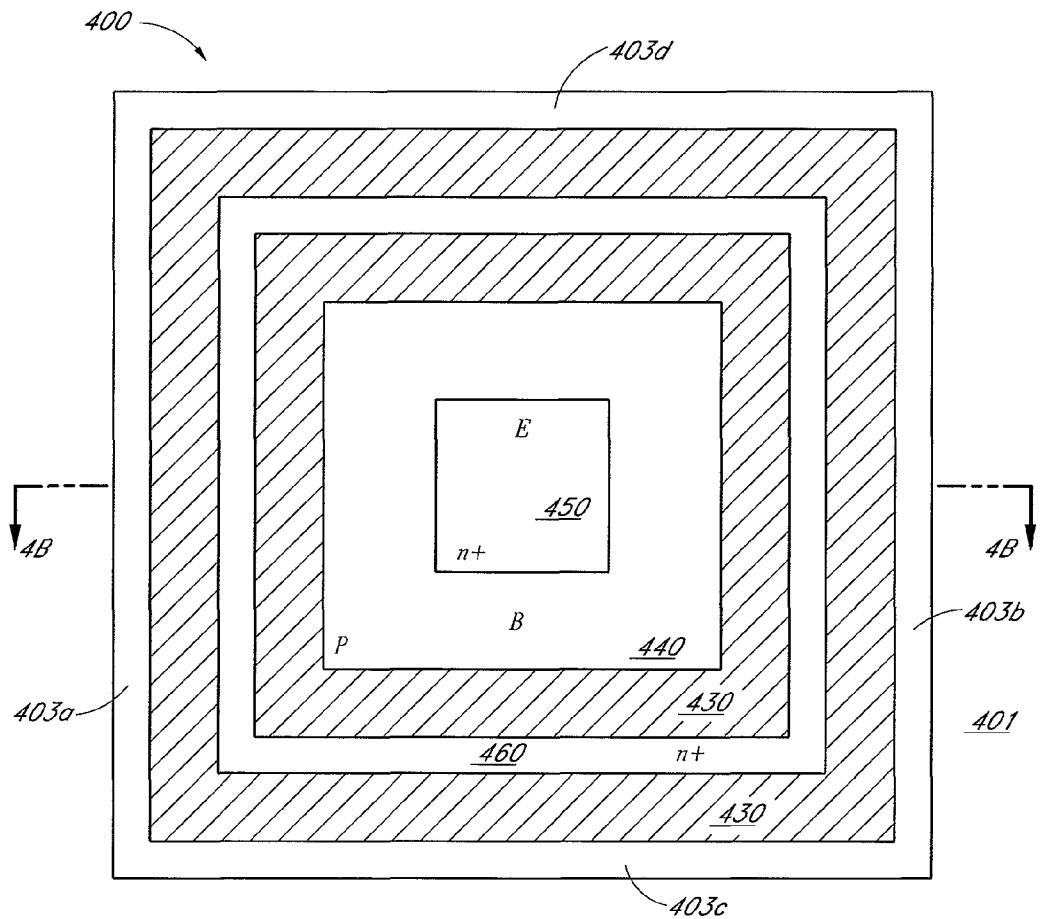
FIG. 4A is a top plan view of a conventional bipolar ESD protection device.
Figure 4B:
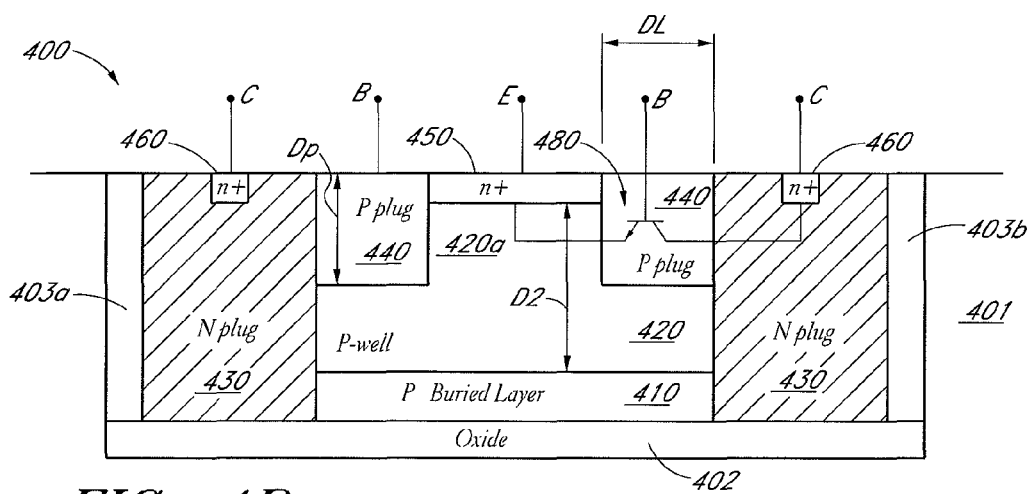
FIG. 4B is a cross-section of the conventional bipolar ESD protection device of FIG. 4A, taken along the lines 4B-4B.

Referring to FIGS. 4A and 4B, a conventional ESD protection device having a bipolar transistor configuration will be described below. The illustrated ESD protection device 400 can be a silicon-on-insulator (SOI) isolated well device. As such, the protection device 400 sits in its own "island" of semiconductor material, which is formed in a well of insulation and is insulated from the devices outside the well on the same monolithic integrated circuit. In this example, a handle wafer acts as a carrier substrate 401 and has a buried oxide layer 402 formed of silicon dioxide on the wafer.

Trench side walls 403a-403d are also formed (typically of silicon dioxide) so as to isolate the island of silicon forming the protection device 400 in a well formed by the layer 402 and the side walls 403a-403d. The process for forming the layer 402 and the side walls 403a-403d can be a conventional fabrication process. In other arrangements, the well of semiconductor material can be junction isolated. Such a well can be referred to as a well of isolation or insulation. The protection device 400 can include a P buried layer 410, a P well 420, an N plug 430, a P plug 440, an N+ emitter region 450, and an N+ collector region 460. The components of the protection device 400 can be formed by a bipolar process or a BiCMOS process.

The P buried layer 410 is formed on the buried oxide layer 402, and contains p-type dopants. The P well 420 is formed on the P buried layer 410. The N plug 430 is formed on the buried oxide layer 402, and is adjacent to the P well 420 such that the N plug 430 is surrounded and contacted by the side walls 403a-403d while surrounding and contacting the P well 420 and the P plug 440. The N plug 430 includes the N+ collector region 460 at the top portion thereof. The N plug 430 can form a collector ring.

The P plug 440 has an annular shape such that it surrounds a central portion 420a of the P well 420 while overlying other portions of the P well 420. In addition, the P plug 440 laterally surrounds the N+ emitter region 450. The P plug 440 can have a depth Dp (from the top surface of the substrate 401) that is shallower than the P well 420 and deeper than the N+ emitter region 450. The N+ emitter region 450 overlies the central portion 420a of the P well 420, and is laterally surrounded by the P plug 440.

In the protection device 400, a lateral bipolar transistor 480 is formed to have an emitter at the N+ emitter region 450, a base at the P plug 440, and a collector at the N plug 430 and the N+ collector region 460. The emitter and collector of the transistor 480 can be electrically coupled to first and second nodes, respectively, of an internal circuit to be protected. For example, the first and second nodes can be any two of the nodes 161, 162, 163, 164 of FIG. 1.

A lateral distance DL between the N+ emitter region 450 (or the emitter) and the N plug 430 (or the collector) determines the trigger voltage $V_T$ of the protection device 400. Thus, the trigger voltage $V_T$ of the protection device 400 can be adjusted by selecting the lateral distance DL. In some examples, the lateral distance DL can be between about 1 μm and about 12 μm, or alternatively between about 5 μm and about 15 μm.

A current flowing through a bipolar transistor in an ESD protection device can be expressed in Equation (1) below. Such a current can be referred to as a "snapback current" (Is) in the context of this document.

$$Is \approx \beta \cdot k V_H \qquad \text{Equation (1)}$$

In Equation (1), β is the gain of the bipolar transistor, k is a constant of proportionality, and $V_H$ is the holding voltage of the transistor. Thus, $V_H$ is inversely proportional to the gain. The holding voltage $V_H$ can be adjusted by changing the gain of the transistor.

The protection device 400 can effectively operate to provide ESD protection when an overvoltage condition (or transmission line pulse (TLP)) has a maximum voltage of lower than 100 V, or preferably about 70 V. In such an instance, the trigger voltage of the protection device 400 can be below 100 V.

However, if the protection device 400 is to operate at an overvoltage condition in a voltage range between about 100 V and 200 V, the protection device 400 should also have a trigger voltage in that voltage range. This can be accomplished by increasing the lateral distance DL of the device 400 over that used for a trigger voltage of less than 100 V. However, when the lateral distance DL is increased, a current flowing from the collector (the N+ collector region 460 of FIG. 4B) to the emitter (N+ emitter region 450 of FIG. 4B) of the lateral bipolar transistor 480 becomes concentrated in a small region between them. This can result in an increase in the temperature of the protection device 400, which can significantly damage the device. Thus, there is a need for an ESD protection device that can operate with overvoltage conditions in a voltage range between about 100 V and about 200 V.

Figure 5A:
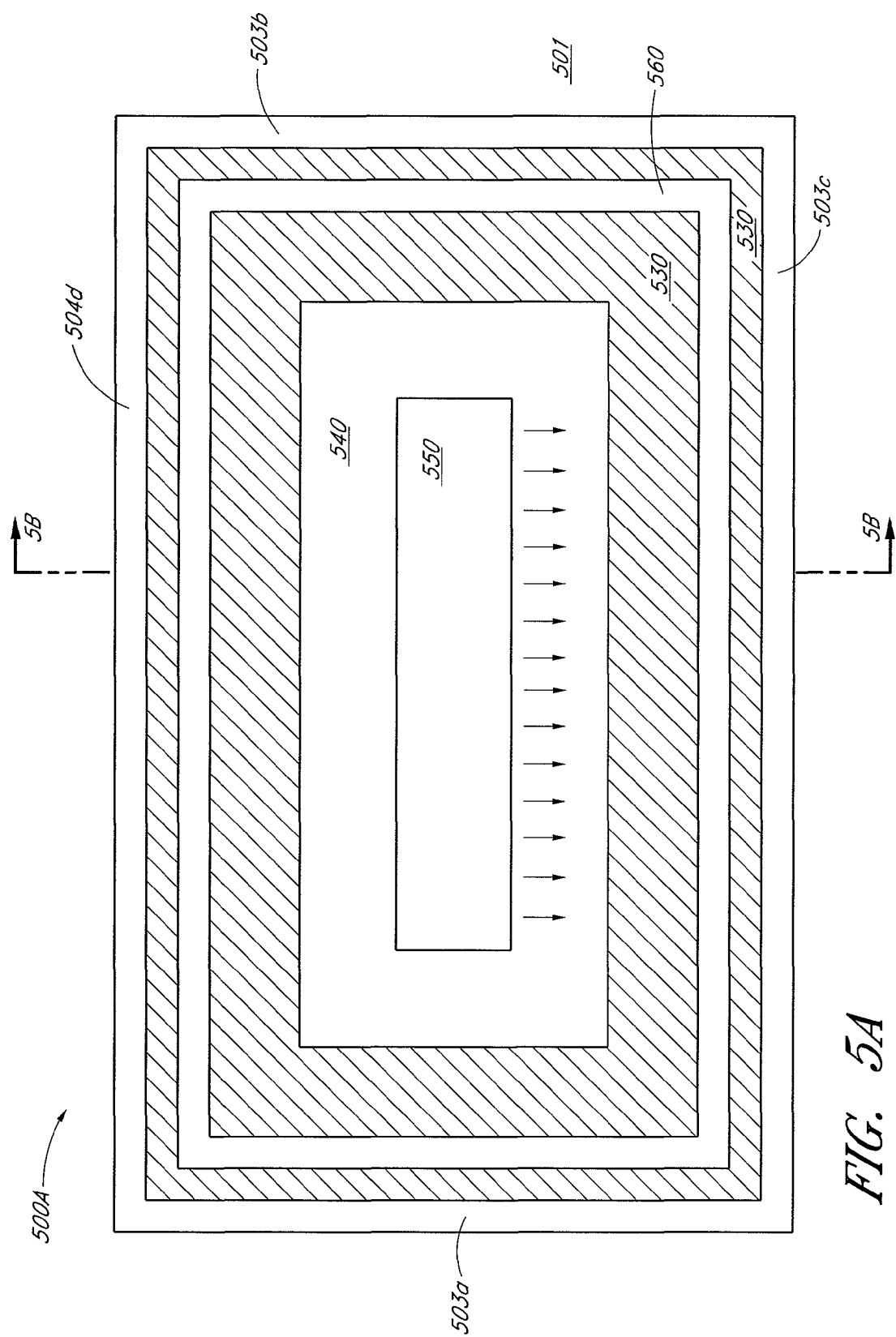
FIG. 5A is a top plan view of a bipolar ESD protection device according to one embodiment.
Figure 5B:
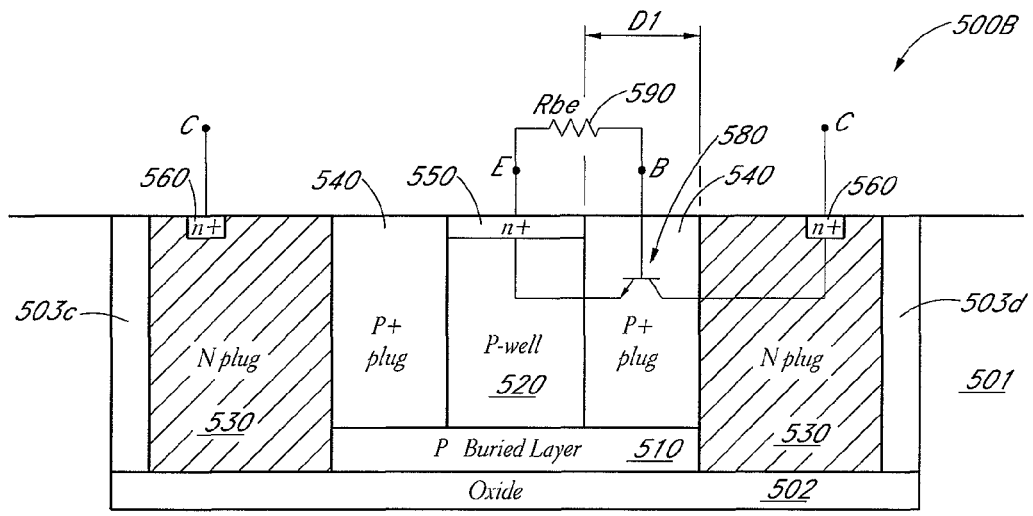
FIG. 5B is a cross-section of the bipolar ESD protection device of FIG. 5A, taken along the lines 5B-5B.

Referring to FIGS. 5A and 5B, an ESD protection device according to one embodiment will be described below. The illustrated ESD protection device 500A can be a silicon-on-insulator (SOI) isolated well device. As such, the protection device 500A sits in its own "island" of semiconductor material, which is formed in a well of insulation and is insulated from the devices outside the well on the same monolithic integrated circuit. In this example, a handle wafer 501 acts as a carrier substrate and has a buried oxide layer 502 formed of silicon dioxide on the wafer 501.

Trench side walls 503a-503d are also formed (typically of silicon dioxide) so as to isolate the island of silicon forming the protection device 500A in a well formed by the layer 502 and the side walls 503a-503d. The process for forming the layer 502 and the side walls 503a-503d can be a conventional fabrication process. In other arrangements, the well of semiconductor material can be junction isolated. Such a well can be referred to as a well of isolation or insulation.

The protection device 500A can include a P buried layer 510, a P well 520, an N plug 530, a P+ plug 540, an N+ emitter region 550, and an N+ collector region 560. The components of the protection device 500A can be formed by, for example, a bipolar process or a BiCMOS process. The configurations of the P buried layer 510, the P well 520, the N plug 530, the N+ emitter region 550, and the N+ collector region 560 can be as described above in connection with the P buried layer 410, the P well 420, the N plug 430, the N+ emitter region 450, and the N+ collector region 460 of FIGS. 4A and 4B.

In the device 500A, a lateral bipolar transistor 580 is configured to have an emitter at the N+ emitter region 550, a base at the P+ plug 540, and a collector at the N plug 530 and the N+ collector region 560. The emitter and collector of the transistor 580 can be coupled to first and second nodes, respectively, of an internal circuit to be protected. For example, the first and second nodes can be any two of the nodes 161, 162, 163, 164 of FIG. 1.

In the illustrated embodiment, the N+ emitter region 550 and the P+ plug 540 are electrically coupled to an emitter-base resistor 590 such that a first end of the resistor 590 is coupled to the N+ emitter region 550 and a second end of the resistor 590 is coupled to the P+ plug 540. The emitter-base resistor 590 can have a resistance Rbe of about 801Ω to about 5 kΩ. The emitter-base resistor 590 facilitates uniform distribution of a current substantially across a region between the N+ emitter region 550 and the N plug 530, thereby reducing temperature increase.

As a result, a lateral distance D1 between the n+ emitter region 550 (or the emitter) and the N plug 530 (or the collector) can be increased to have a trigger voltage $V_T$ between about 100 V and about 200 V without damaging the protection device 500A. FIG. 6A shows a relationship between a transmission line pulse (TLP) voltage and a TLP current of an ESD protection device having a diode TLP adjustable trigger mechanism. In the diode TLP adjustable trigger mechanism, a diode trigger voltage corresponds to the voltage when a reverse-biased PN junction reaches impact ionization to generate a current. With an ESD protection device having a diode TLP adjustable trigger mechanism, the diode trigger voltage can be adjusted by changing the layout spacing (for example, the lateral distance DL of FIG. 4B) between n-type and p-type regions that define the diode junction.

FIG. 6B shows a relationship between the lateral distance D1 and the trigger voltage of the protection device 500A of FIGS. 5A and 5B, which has a bipolar TLP adjustable trigger mechanism. In the protection device 500, the collector-base junction is substantially the same as the pn junction of a pn junction diode. However, the pn junction is built into a bipolar device that gains an impact ionization current generated by a diode breakdown, and, as a result, the breakdown voltage of the bipolar device is related to the diode breakdown and the gain of the bipolar device. Thus, in the bipolar TLP adjustable trigger mechanism, a bipolar trigger voltage is substantially the same as the diode trigger voltage except that the reverse-biased diode is part of a bipolar device that amplifies the impact ionization current. As a result, the bipolar trigger voltage is at a lower value than the diode trigger voltage, depending on the gain of the bipolar device.

In addition, the P+ plug 540 of the protection device 500A is different from the P plug 440 of FIGS. 4A and 4B in that it extends down to contact a top surface of the P buried layer 510. By having the deeper P+ plug 540 than the P plug 440 of FIG. 4B, the gain β2 of the transistor 580 of FIG. 5B is smaller that the gain β1 of the transistor 480 of FIG. 4B. As such, the holding voltage $V_{H2}$ of the transistor 580 can be greater than the holding voltage $V_{H1}$ of the transistor 480, as indicated by Equation (2) below.

$$V_{H2} = V_{H1} \frac{\beta 1}{\beta 2} \qquad \text{Equation (2)}$$

In another embodiment, the gain β2 of the transistor 580 can be decreased by increasing the doping concentration of the P+ plug 540. For example, the doping concentration of the P+ plug 540 can be between about $1\times10^{15}/cm^3$ and about $5\times10^{18}/cm^3$. In yet another embodiment, the gain β2 of the transistor 580 can be decreased by increasing the depth and the doping concentration of the P+ plug 540. In an alternative embodiment, the holding voltage of the transistor 580 can be adjusted by changing the gain of the transistor 580. The gain can be adjusted, using the lateral distance D1 or the doping concentration of the P+ plug 540.

Figure 6C:
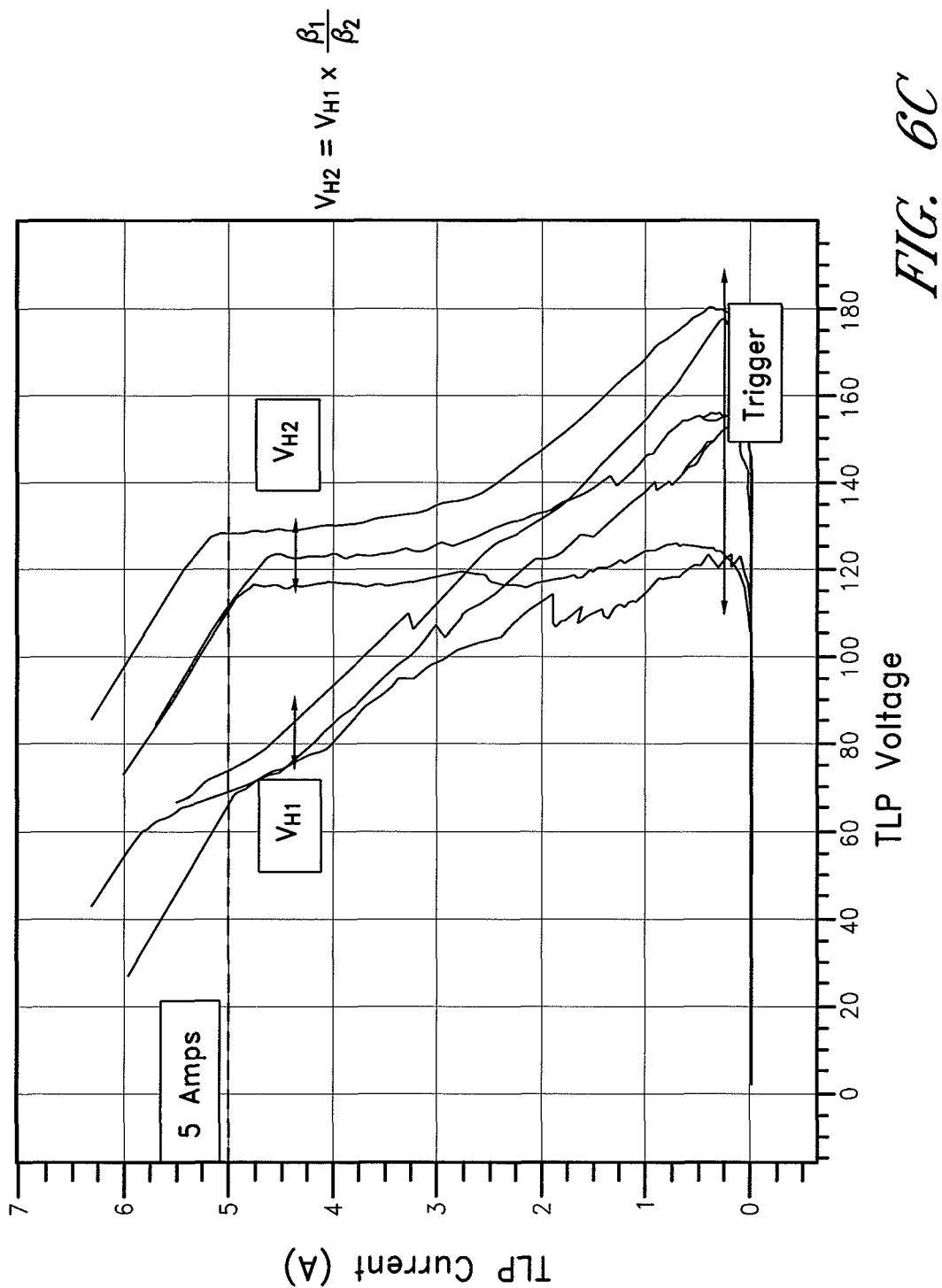
FIG. 6C is a graph showing a relationship between transmission line pulse (TLP) voltage and TLP current of ESD protection devices according to embodiments with different holding voltages.

FIG. 6C shows an example of a relationship between the TLP voltage and TLP current of a protection device. FIG. 6C also shows a trigger voltage and the holding voltages $V_{H1}$ and $V_{H2}$ of the devices 400 and 500A having different P plug configurations.

Figure 6D:
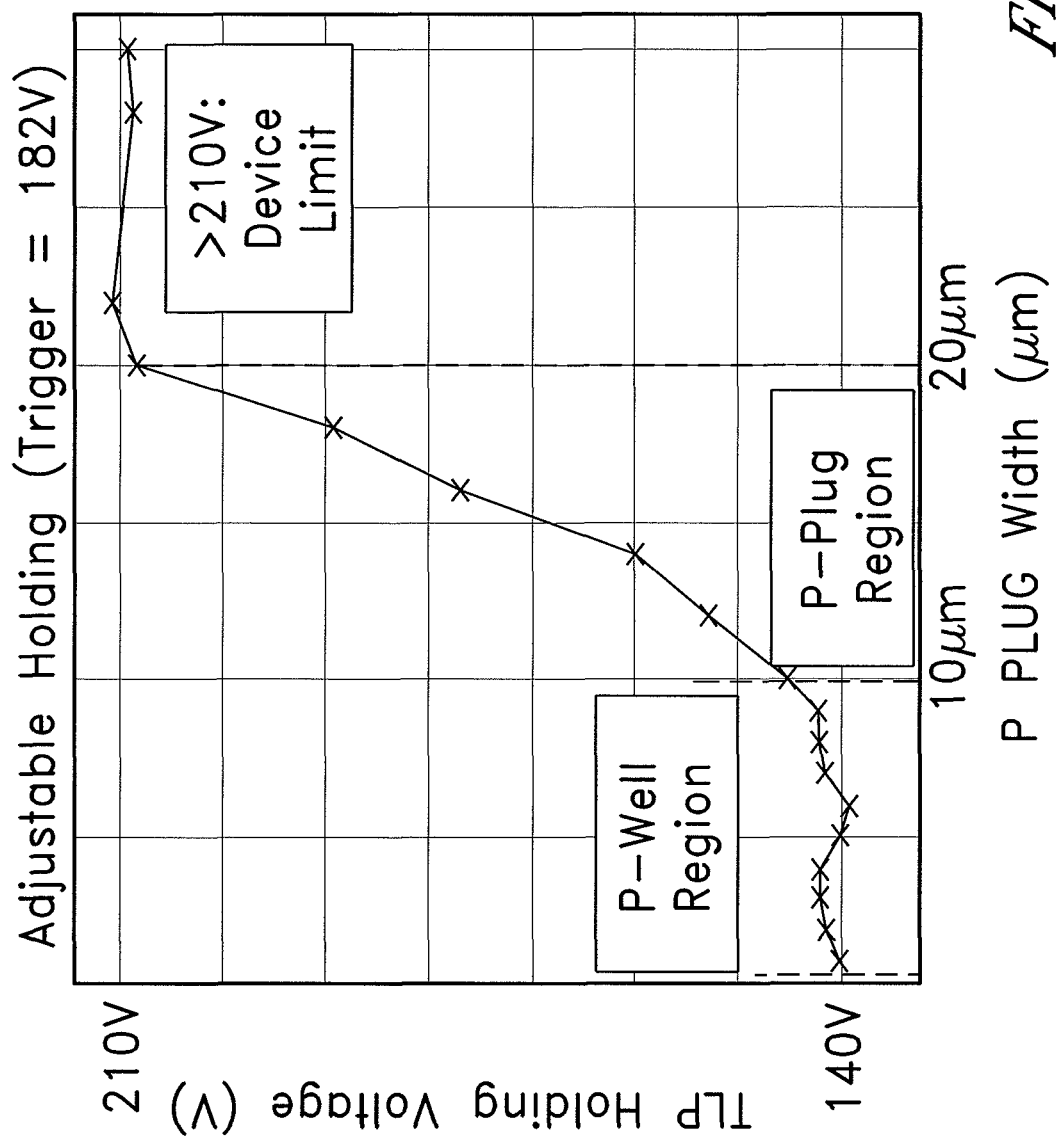
FIG. 6D is a graph showing a relationship between transmission line pulse (TLP) voltage and a lateral distance of an ESD protection device according to one embodiment.

In yet another embodiment, the holding voltage of the protection device 500A can be adjusted by having a selected lateral distance D1 between the n+ emitter 550 (or the emitter) and the N plug 530 (or the collector). FIG. 6D shows a relationship between the lateral distance D1 and the TLP holding voltage of the protection device 500.

Referring back to FIG. 3, in one embodiment, the first ESD protection circuit 310 can have the structure described above in connection with FIGS. 4A and 4B, while the second ESD protection circuit 320 can have the structure described above in connection with FIGS. 5A and 5B. In such an embodiment, the first and second ESD protection circuits 310, 320 can be implemented in the same or similar structure with different dimensions or spacing, depending on the desired ESD voltage ranges. Further, by adding a passive element, such as the base-emitter resistor 590 of FIG. 5B, the second ESD protection circuit 320 can provide desired ESD protection at a higher voltage without damages.

Figure 5C:
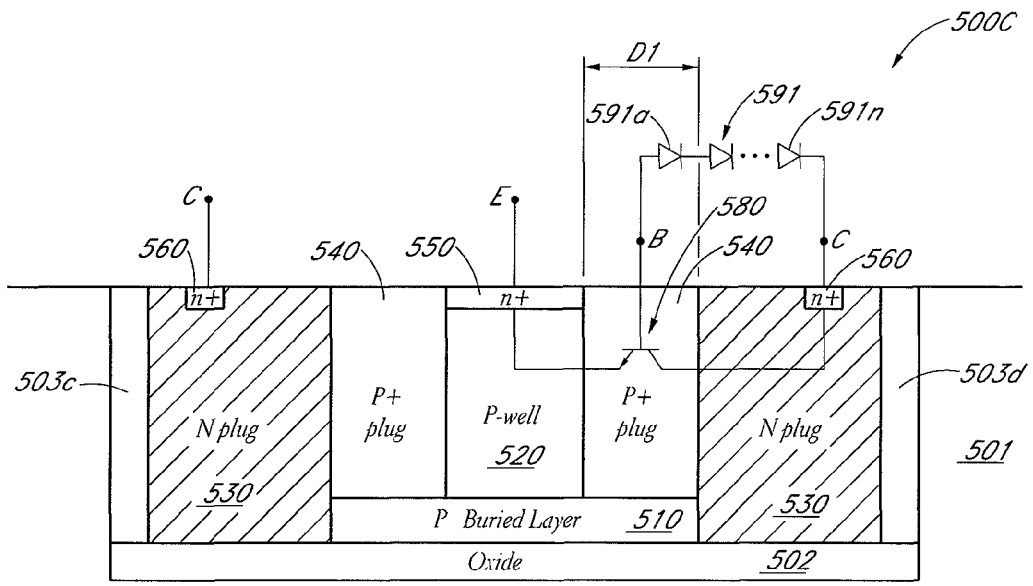
FIG. 5C is a cross-section of a bipolar ESD protection device according to another embodiment.

Referring to FIG. 5C, an ESD protection bipolar device according to another embodiment will be described below. The illustrated ESD protection bipolar device 500C can be a silicon-on-insulator (SOI) isolated well device. In the illustrated embodiment, a handle wafer 501 acts as a carrier substrate and has a buried oxide layer 502 formed of silicon dioxide on the wafer 501.

The ESD protection bipolar device 500C can include trench side walls 503c, 503d, a P buried layer 510, a P well 520, an N plug 530, a P+ plug 540, an N+ emitter region 550, and an N+ collector region 560. The configurations of the handle wafer 501, the buried oxide layer 502, the trench side walls 503c, 503d, the P buried layer 510, the P well 520, the N plug 530, the P+ plug 540, the N+ emitter region 550, and the N+ collector region 560 can be as described above in connection with FIGS. 5A and 5B. In another embodiment, the configuration of the P+ plug 540 can be as described above in connection with the P plug 440 of FIG. 4B. The emitter E and collector C of the device 500C can be coupled to first and second nodes, respectively, of an internal circuit to be protected. For example, the first and second nodes can be any two of the nodes 161, 162, 163, 164 of FIG. 1.

The ESD protection bipolar device 500C can also include an array 591 of p-n junction diodes coupled in series between the P+ plug 540 and the N+ collector region 560. The array 591 of diodes can include first to n-th diodes 591a-591n, wherein n can be an integer equal to or greater than 1. The first diode 591a can include an anode coupled to the P+ plug 540, and a cathode coupled to the anode of a second diode in the array 591. The n-th diode 591n can include an anode coupled to the cathode of an (n−1)-th diode in the array 591, and a cathode coupled to the N+ collector region 560.

By selecting the number of diodes in the array 591, the trigger voltage of the bipolar device 500C can be adjusted to a desired level. For example, by adding one or more diodes to the array 591, the trigger voltage of the bipolar device 500C can be increased.

Figure 5D:
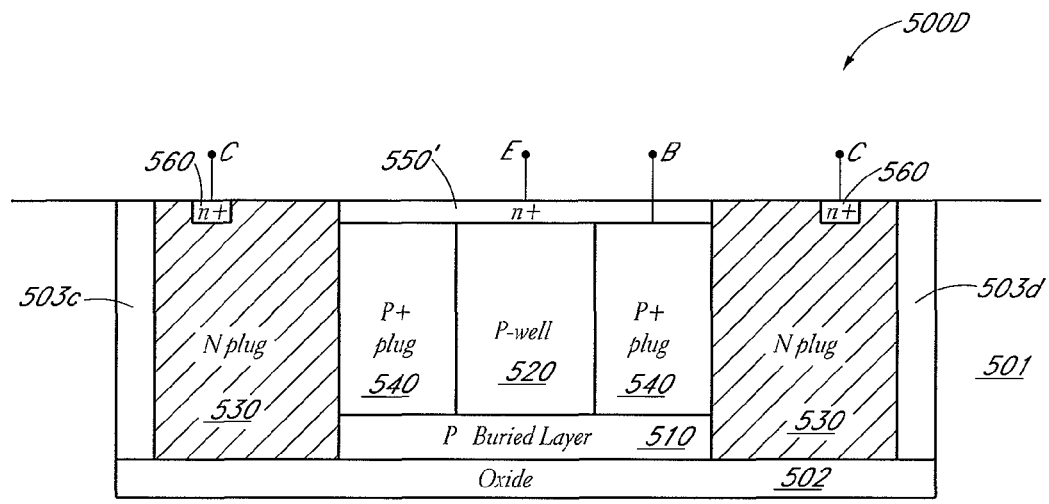
FIG. 5D is a cross-section of a bipolar ESD protection device according to yet another embodiment.

Referring to FIG. 5D, an ESD protection bipolar device according to yet another embodiment will be described below. The illustrated ESD protection bipolar device 500D can be a silicon-on-insulator (SOI) isolated well device. In the illustrated embodiment, a handle wafer 501 can act as a carrier substrate and has a buried oxide layer 502 formed of silicon dioxide on the wafer 501.

The ESD protection bipolar device 500D can include trench side walls 503c, 503d, a P buried layer 510, a P well 520, an N plug 530, a P+ plug 540, an extended N+ emitter region 550', and an N+ collector region 560. The configurations of the handle wafer 501, the buried oxide layer 502, the trench side walls 503c, 503d, the P buried layer 510, the P well 520, the N plug 530, the P+ plug 540, and the N+ collector region 560 can be as described above in connection with FIGS. 5A and 5B. In another embodiment, the configuration of the P+ plug 540 can be as described above in connection with the P plug 440 of FIG. 4B. The emitter E and collector C of the device 500C can be coupled to first and second nodes, respectively, of an internal circuit to be protected. For example, the first and second nodes can be any two of the nodes 161, 162, 163, 164 of FIG. 1.

In the illustrated ESD protection bipolar device 500D, the extended N+ emitter region 550' extends through a top portion of the P+ plug 540, and can contact the N plug 530. In another embodiment, the extended N+ emitter region 550' extends through only part of the top portion of the P+ plug 540, and does not contact the N plug 530.

By having the extended N+ emitter region 550', the trigger voltage of the device 500D can be adjusted. Rather than having a violent impact ionization trigger mechanism, the device 500D can have a more resistive punch-through mechanism to turn on the device 500D, which can increase the trigger voltage.

Figure 5E:
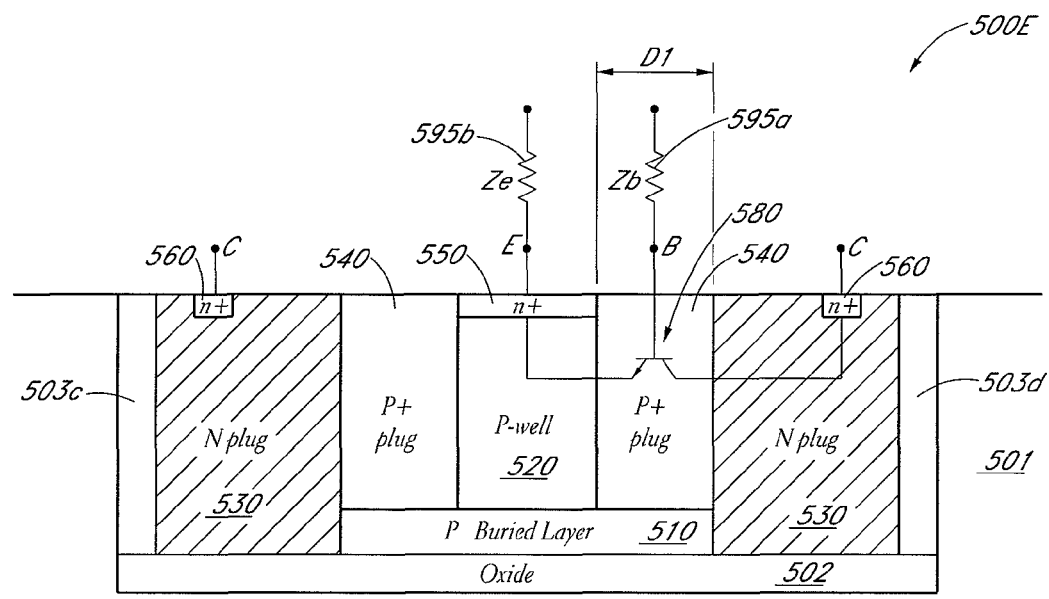
FIG. 5E is a cross-section of a bipolar ESD protection device according to yet another embodiment.

Referring to FIG. 5E, an ESD protection bipolar device according to yet another embodiment will be described below. The illustrated ESD protection bipolar device 500E can be a silicon-on-insulator (SOI) isolated well device. In the illustrated embodiment, a handle wafer 501 acts as a carrier substrate and has a buried oxide layer 502 formed of silicon dioxide on the wafer 501.

The ESD protection bipolar device 500E can include trench side walls 503c, 503d, a P buried layer 510, a P well 520, an N plug 530, a P+ plug 540, an N+ emitter region 550, and an N+ collector region 560. The configurations of the handle wafer 501, the buried oxide layer 502, the trench side walls 503c, 503d, the P buried layer 510, the P well 520, the N plug 530, the P+ plug 540, the N+ emitter region 550, and the N+ collector region 560 can be as described above in connection with FIGS. 5A and 5B. In another embodiment, the configuration of the P+ plug 540 can be as described above in connection with the P plug 440 of FIG. 4B.

The ESD protection bipolar device 500E can also include a base resistor 595a electrically coupled to the P+ plug 540, and an emitter resistor 595b electrically coupled to the N+ emitter region 550. The base resistor 595a can have a resistance Zb of about 0Ω to about 200Ω. The emitter resistor 595b can have a resistance Ze of about 0Ω to about 200Ω. In one embodiment, the emitter resistor 595b can have a structure which will be described in connection with FIG. 10C.

The emitter resistor 595b can have a first end and a second end. The first end of the emitter resistor 595b can be coupled to the N+ emitter region 550. The second end of the emitter resistor 595b and the collector C of the device 500E can be coupled to first and second nodes, respectively, of an internal circuit to be protected. For example, the first and second nodes can be any two of the nodes 161, 162, 163, 164 of FIG. 1.

If Zb approaches 0, the device 500E can have a relatively high holding voltage. In contrast, if Ze approaches 0, the device 500E can have a relatively low holding voltage. In configurations between the above two extreme configurations, as Ze is increased to be greater than Zb, the holding voltage of the device 500E can be increased.

ESD Protection Device with a Silicon-Controlled Rectifier Configuration

Referring to FIGS. 7A to 7C, a conventional ESD protection device having a silicon-controlled rectifier (SCR) configuration will be described below. The illustrated protection device 700 includes a p-type substrate 701, a first n well 710, a second n well 720, a first n+ region 721, a second n+ region 722, a first p+ region 731, and a second p+ region 732.

The first n well 710 and the second n well 720 are formed in the p-type substrate 701, and are spaced apart from each other with a central portion 701a of the substrate 701 interposed therebetween. The first and second n wells 710, 720 have a first depth D1 from a top surface of the substrate 701. The first n+ region 721 is formed in the first n well 710, and has a second depth D2 from the top surface of the substrate 701.

The first p+ region 731 is formed in the first n well 710 and has the second depth D2 from the top surface of the substrate 701. The first p+ region 731 is formed adjacent to the first n+ region 721 such that the first p+ region 731 is laterally interposed between the first n+ region 721 and a top portion of the first n well 710.

The second p+ region 732 is formed in the in the second n well 720 and has the second depth D2 from the top surface of the substrate 701. The second p+ region 732 is formed adjacent to the second n+ region 722 such that the second p+ region 732 is laterally interposed between the second n+ region 722 and a top portion of the second n well 720.

In the illustrated embodiment, a silicon-controlled rectifier is formed to have a first bipolar transistor 751, and a second bipolar transistor 752. The first bipolar transistor 751 can be an NPN bipolar transistor having an emitter at the first n+ region 721, a base at the p-type substrate 701, and a collector at the second n well 720. The second bipolar transistor 752 can be a PNP bipolar transistor having an emitter at the second p+ region 732, a base at the second n well 720, and a collector at the p-type substrate 701.

FIG. 7B shows a circuit diagram of the first and second transistors 751, 752. The circuit shown in FIG. 7B forms a silicon-controlled rectifier (SCR) 750. In the silicon-controlled rectified 750, the emitter of the second transistor 752 can also be referred to as the anode of the SCR 750. The emitter of the first transistor 751 can also be referred to as the cathode of the SCR 750. In addition, the base of the first transistor 751 and the collector of the second transistor 752 are electrically coupled to each other, and can be referred to as the gate of the SCR 750. A symbol representing an SCR having an anode, a cathode, and a gate is shown in FIG. 7C. The anode and cathode of the SCR 750 are electrically coupled to two nodes for ESD protection of an internal circuit, for example, as shown in FIG. 1.

The protection device 700 of FIG. 7A can be used to provide a trigger voltage between about 200 V and about 300 V. However, the protection device 700 can have thermal runaway for a trigger mechanism for such a relatively high voltage, and can be subjected to destructive power surges for such high trigger voltages due to violent impact ionization. In addition, the protection device 700 can have relatively high power snapback currents that inject more free carriers than the doping concentration, and as a result it can be difficult to turn off the device 700 by controlling the holding voltage. Further, there is a need for externally controlling the gain of the NPN and PNP transistors 751, 752 of the protection device 700. In addition, there is a need for providing a relatively high power ESD rating by conducting large currents at high voltages while reducing or maintaining the layout area of the device.

Figure 8A:
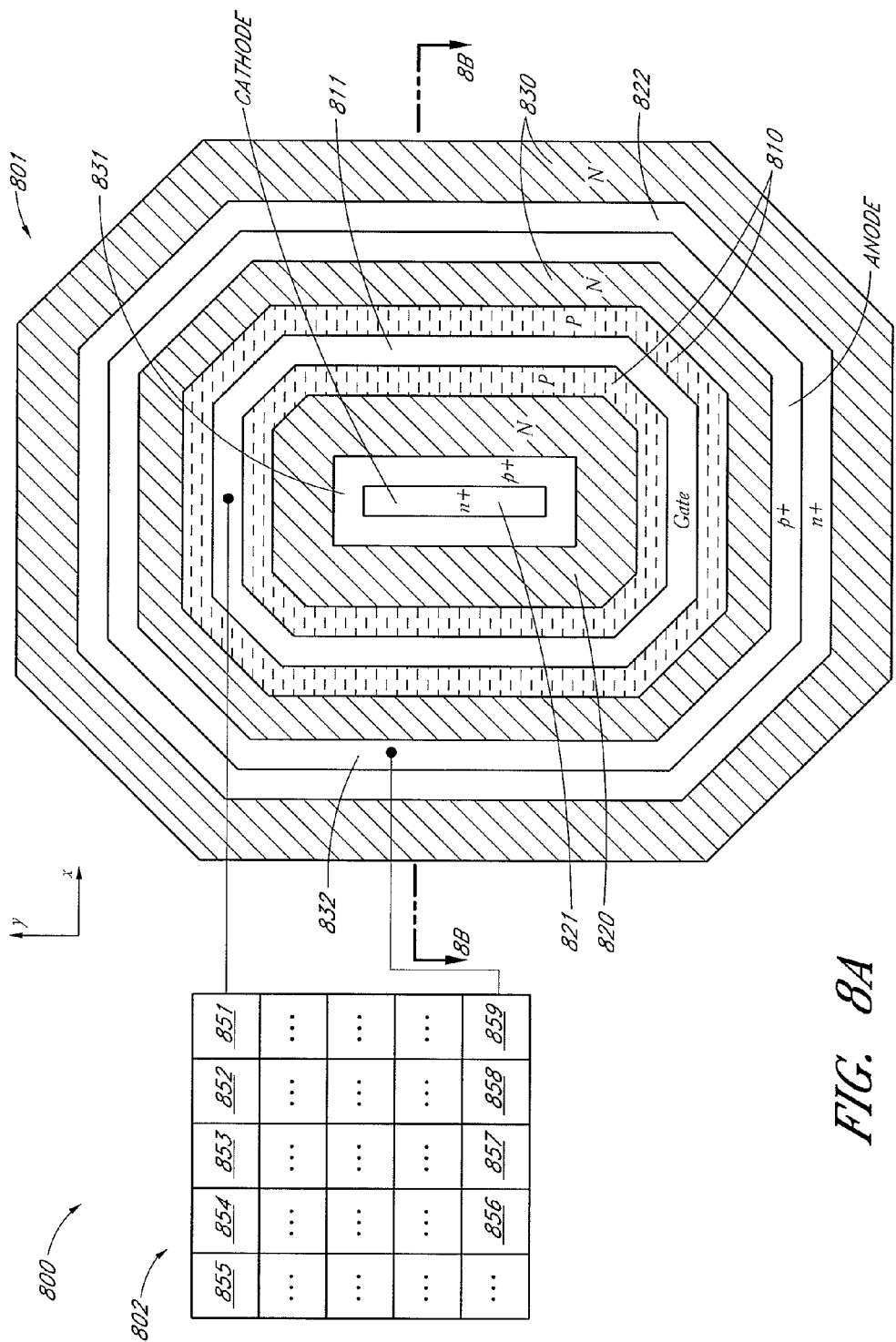
FIG. 8A is a top plan view of an SCR ESD protection device according to another embodiment.
Figure 8B:
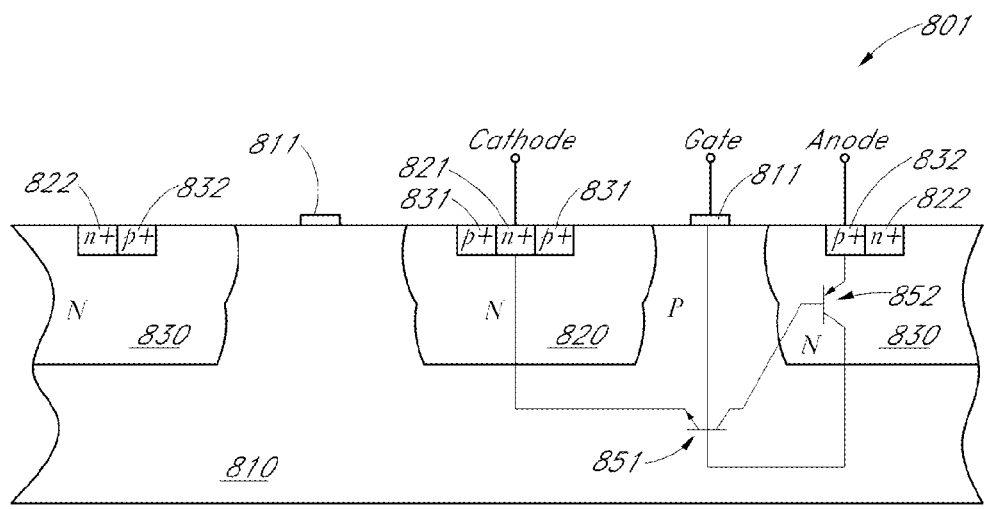
FIG. 8B is a cross-section of the device 800, taken along the lines 8B-8B.
Figure 8C:
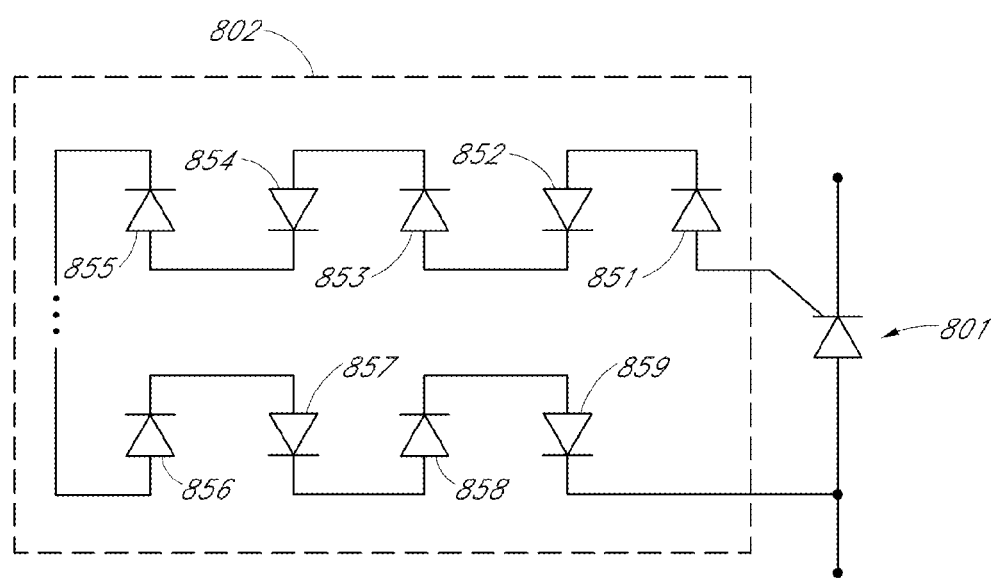
FIG. 8C is a circuit diagram of the SCR ESD protection device of FIG. 8A.

Referring to FIGS. 8A-8C, an ESD protection device having a silicon-controlled rectifier (SCR) configuration according to one embodiment will be described below. The illustrated protection device 800 includes an SCR device 801 and a diode array 802. FIG. 8A is a top plan view of the device 800, and FIG. 8B is a cross-section of the device 800, taken along the lines 8B-8B. FIG. 8C is a schematic circuit diagram of the device 800. In some embodiments, the SCR device 801 can be a silicon-on-insulator (SOI) isolated well device. As such, the SCR device 801 sits in its own "island" of semiconductor material, which is formed in a well of insulation and is insulated from the devices outside the well on the same monolithic integrated circuit.

The SCR device 801 can include a p-type region 810, a first n well 820, and a second n well 830. The first n well 820 is laterally surrounded by the p-type region 810. The p-type region 810 is laterally surrounded by the second n well 830. The p-type region 810 and the second n well 830 have an annular shape when viewed from above.

The SCR device 801 can also include a first n+ region 821, a second n+ region 822, a first p+ region 831, a second p+ region 832, and a gate contact 811. The first n+ region 821 is formed in the first n well 820, and extends in the y-direction in FIG. 8A, having an elongated shape when viewed from above. The first p+ region 831 is also formed in the first n well 820, and laterally surrounds the first n+ region 821, forming an annular shape when viewed from above. The second n+ region 822 is formed in the second n well 830, and extends along the second n well 830, forming an annular shape when viewed from above. The second p+ region 832 is also formed in the second n well 830, and extends along the second n well 830, and adjacent to the second n+ region 822. The second p+ region 832 also has an annular shape when viewed from above, and laterally surrounded and contacted by the second n+ region 822. The gate contact 811 is formed on the p-type region 810, and extends to form an annular shape when viewed from above.

The first n+ region 821 can serve as the cathode of the SCR device 801, and the second p+ region 832 can serve as the anode of the SCR device 801. The cathode and anode of the SCR device 801 can be electrically coupled to first and second nodes, respectively, of an internal circuit to be protected. For example, the first and second nodes can be any two of the nodes 161, 162, 163, 164 of FIG. 1. As shown in FIG. 8B, the SCR device 801 is formed to have a first bipolar transistor 851, and a second bipolar transistor 852. The first bipolar transistor 851 can be an NPN bipolar transistor having an emitter at the first n+ region 821, a base at the p-type substrate 810, and a collector at the second n well 830. The second bipolar transistor 852 can be a PNP bipolar transistor having an emitter at the second p+ region 832, a base at the second n well 830, and a collector at the p-type substrate 810.

The diode array 802 can include one or more p-n junction diodes connected in series, as shown in FIG. 8C. The diode array 802 can include one or more diodes, for example, first to n-th diodes 851-859, in which n is an integer equal to or greater than 1. The first diode 851 can have an anode electrically coupled to the gate contact 811 of the SCR device 801, and a cathode electrically coupled to the anode of the second diode 852. The second diode 852 has an anode electrically coupled to the cathode of the first diode 851, and a cathode electrically coupled to the anode of the third diode 853. In this manner, an i-th diode has an anode electrically coupled to the cathode of the (i−1)-th diode, and a cathode electrically coupled to the anode of the (i+1)-th diode, in which i is an integer from 2 to n−1. The n-th diode 859 has an anode electrically coupled to the cathode of the (n−1)-th diode 858, and a cathode electrically coupled to the second p+ region 832 (the anode) of the SCR device 801.

In FIG. 8A, the diodes 851-859 are illustrated in a matrix form. A skilled artisan will, however, appreciate that the diodes 851-859 can be arranged in any suitable layout.

By selecting the number of diodes in the array 802, the trigger voltage of the SCR device 801 can be adjusted to a desired level. For example, the addition of the one or more diodes of the array 802 increases the trigger voltage of the SCR device 801 by about 7 V to about 267 V. When the diodes are reverse-biased, they have a low breakdown voltage, for example, 7 V. However, when an array of diodes are used; the total breakdown voltage is the sum of all the diodes. When these diodes break down, they conduct a current into the SCR and turn it on. Once the SCR is on, it absorbs the full ESD event. Therefore, the diodes only act as a trigger for the SCR, which can be adjusted by changing the number of diodes.

Figure 8D:
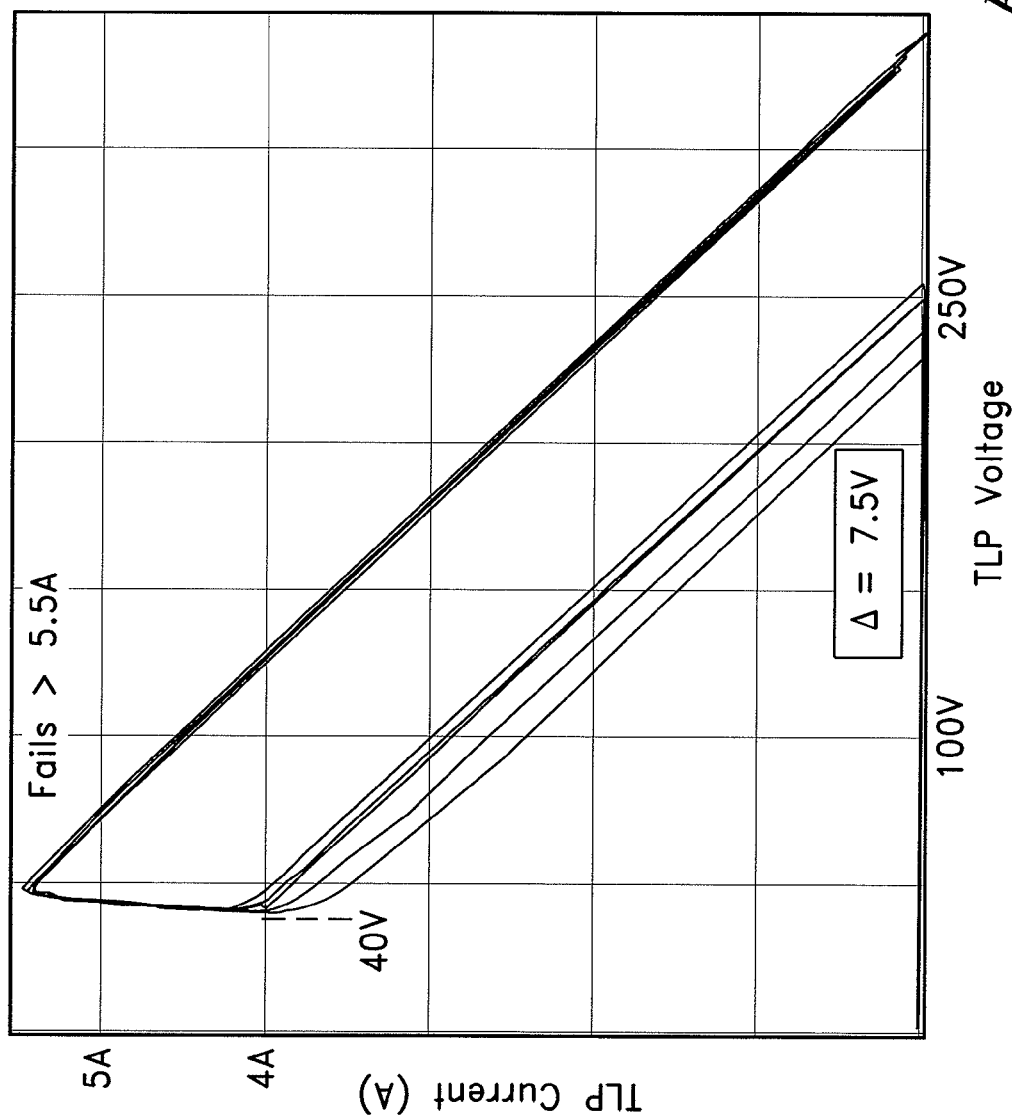
FIG. 8D is a graph showing a relationship between transmission line pulse (TLP) voltage and TLP current of the protection device of FIGS. 8A-8C.

FIG. 8D shows a relationship between transmission line pulse (TLP) voltage and TLP current of the SCR device 801, depending on the number of diodes in the diode array 802. FIG. 8D shows that the trigger voltage of the SCR device 801 can be increased by increasing the number of diodes. In FIG. 8D, a slope having a higher trigger voltage is produced by a device having a greater number of diodes in the diode array 802.

Figure 9A:
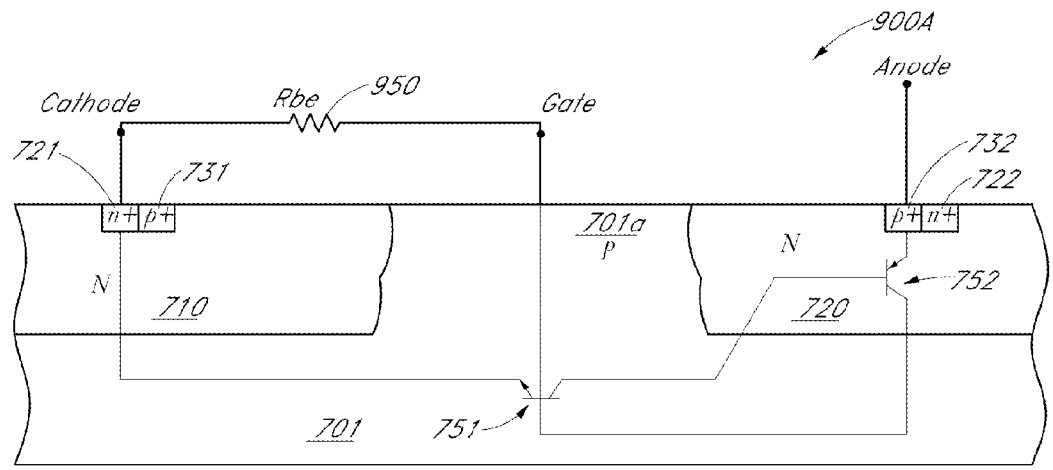
FIG. 9A is a cross-section of an SCR ESD protection device according to yet another embodiment.

Referring to FIG. 9A, an ESD protection device having a silicon-controlled rectifier (SCR) configuration according to another embodiment will be described below. The illustrated SCR device 900A includes a p-type substrate 701, a first n well 710, a second n well 720, a first n+ region 721, a second n+ region 722, a first p+ region 731, and a second p+ region 732. Details of the substrate 701 and the regions or wells 710, 720, 721, 722, 731, 732 can be as described above in connection with the substrate 701 and the regions or wells 710, 720, 721, 722, 731, 732 of FIG. 7A.

The first n+ region 721 can serve as the cathode of the SCR device 900A, and the second p+ region 732 can serve as the anode of the SCR device 900A. The cathode and anode of the SCR device 900A can be electrically coupled to first and second nodes, respectively, of an internal circuit to be protected. For example, the first and second nodes can be any two of the nodes 161, 162, 163, 164 of FIG. 1. As shown in FIG. 9A, the SCR device 900A is formed to have a first bipolar transistor 751, and a second bipolar transistor 752. The first bipolar transistor 751 can be an NPN bipolar transistor having an emitter at the first n+ region 721, a base at the p-type substrate 701, and a collector at the second n well 720. The second bipolar transistor 752 can be a PNP bipolar transistor having an emitter at the second p+ region 732, a base at the second n well 720, and a collector at the p-type substrate 701.

The SCR device 900A, however, has an emitter-base resistor 950 coupled between the first n+ region 721 and the central portion 701a of the p-type substrate 701 via a gate contact (not shown). The emitter-base resistor 950 can have a resistance $R_{BE}$ of about 80Ω to about 15 kΩ. The resistance $R_{BE}$ of the emitter-base resistor 950 can be adjusted to change the holding voltage of the device 900A. In the illustrated protection device, the trigger voltage can be determined by impact ionization, which can be adjusted by changing a spacing between the n-well (the collector) 710 and the central portion (the base) 701a. The emitter-base resistor 950 can also serve to reduce thermal runaway at the trigger voltage.

Figure 9B:
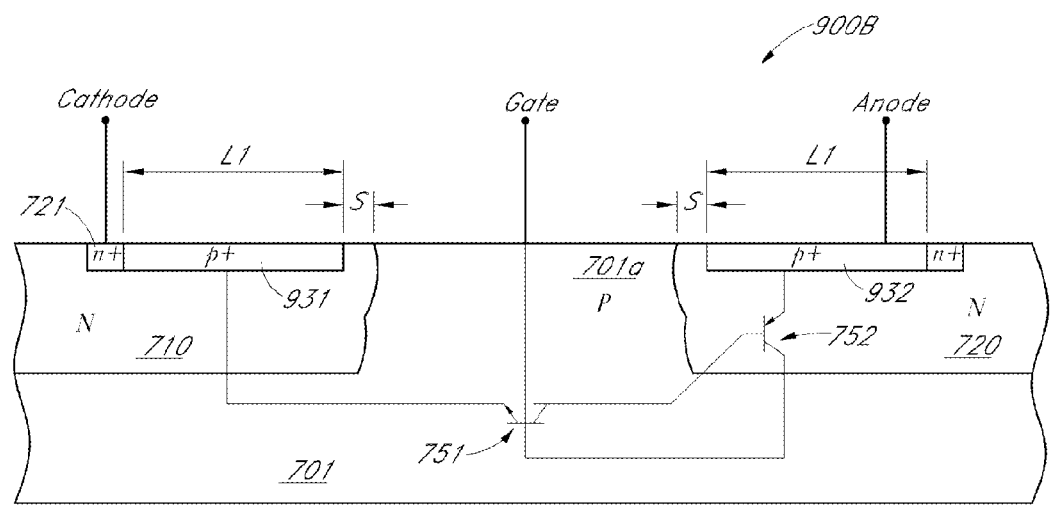
FIG. 9B is a cross-section of an SCR ESD protection device according to yet another embodiment.

Referring to FIG. 9B, an ESD protection device having a silicon-controlled rectifier (SCR) configuration according to yet another embodiment will be described below. The illustrated SCR device 900B includes a p-type substrate 701, a first n well 710, a second n well 720, a first n+ region 721, a second n+ region 722, a first p+ region 931, and a second p+ region 932.

The first n+ region 721 can serve as the cathode of the SCR device 900B, and the second p+ region 932 can serve as the anode of the SCR device 900B. The cathode and anode of the SCR device 900B can be electrically coupled to first and second nodes, respectively, of an internal circuit to be protected. For example, the first and second nodes can be any two of the nodes 161, 162, 163, 164 of FIG. 1. Other details of the substrate 701, and the regions/wells 710, 720, 721, 722, 931, 932, and the first and second bipolar transistors 751 and 752 can be as described above in connection with the substrate 701, the regions/wells 710, 720, 721, 722, 731, 732, and the first and second bipolar transistors 751 and 752 of FIG. 7A except that the first p+ region 931 and the second p+ region 932 are longer in lateral dimension than the first p+ region 731, and the second p+ region 732 of FIG. 7A.

Each of the first p+ region 931 and the second p+ region 932 can have a length L1 between about 2 μm and about 20 μm whereas the first p+ region 731, and the second p+ region 732 of FIG. 7A can have a length between about 2 μm and about 20 μm. Each of the first p+ region 931 and the second p+ region 932 has a spacing S1 from the central portion 701a of the p-type substrate. The spacing S1 can be from about 5 μm to about 30 μm.

By having the above configuration, the trigger voltage of the device 900B can be adjusted. Rather than having a violent impact ionization trigger mechanism, the device 900B can have a more resistive punch-through, which can increase the trigger voltage as the length of the p+ regions 931, 932 is increased.

Figure 10A:
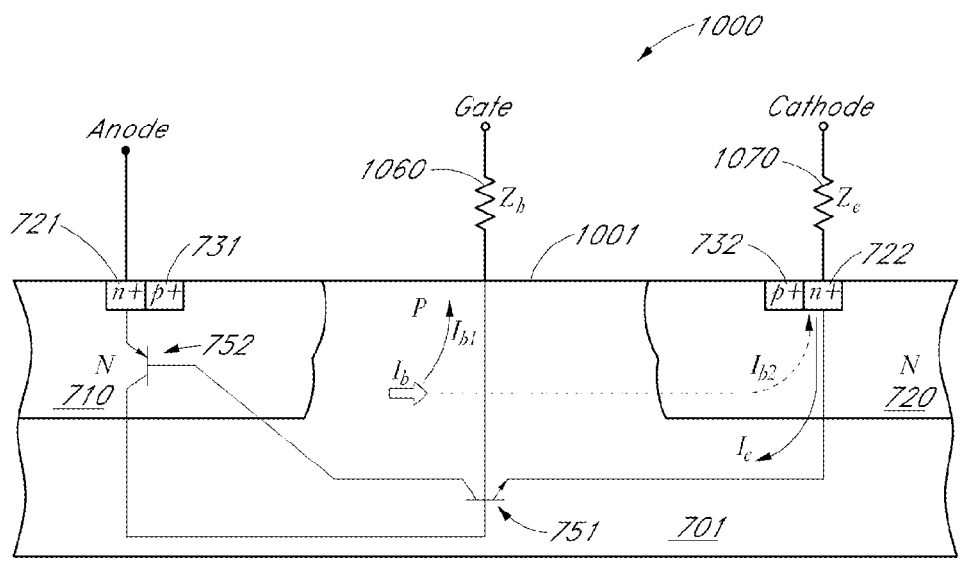
FIG. 10A is a cross-section of an SCR ESD protection device according to yet another embodiment.
Figure 10B:
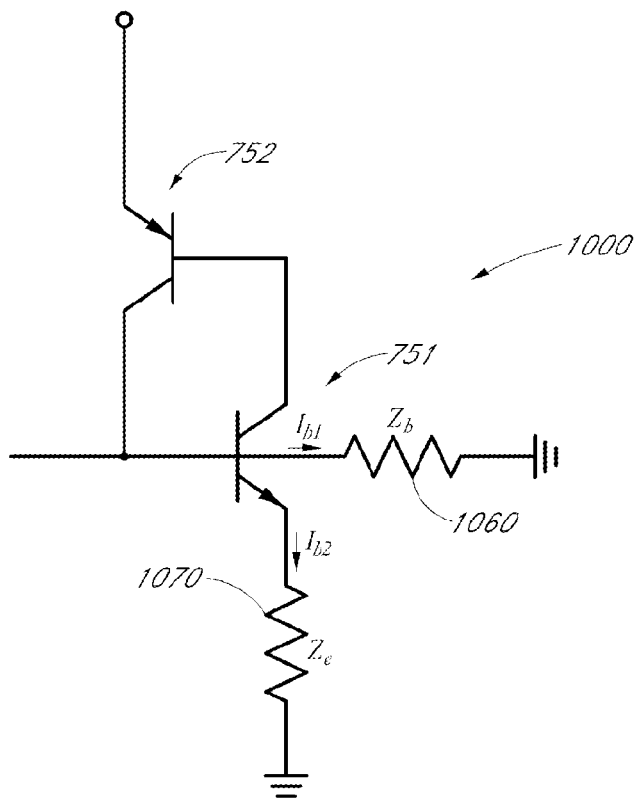
FIG. 10B is a circuit diagram of the SCR ESD protection device of FIG. 10A.

Referring to FIGS. 10A and 10B, an ESD protection device having a silicon-controlled rectifier (SCR) configuration according to yet another embodiment will be described below. The illustrated protection device can include an SCR device 1000 that has a p-type substrate 701, a first n well 710, a second n well 720, a first n+ region 721, a second n+ region 722, a first p+ region 731, and a second p+ region 732.

The second n+ region 722 can serve as the cathode of the SCR device 1000, and the first p+ region 731 can serve as the anode of the SCR device 1000. The cathode and anode of the SCR device 1000 can be electrically coupled to first and second nodes, respectively, of an internal circuit to be protected. For example, the first and second nodes can be any two of the nodes 161, 162, 163, 164 of FIG. 1. Other details of the substrate 701, the region/wells 710, 720, 721, 722, 731, 732, and the first and second bipolar transistors 751 and 752 can be as described above in connection with the substrate 701, the region/wells 710, 720, 721, 722, 731, 732, and the first and second bipolar transistors 751 and 752 of FIG. 7A.

The protection device also includes a base resistor 1060 electrically coupled to the gate of the SCR device 1001, and an emitter resistor 1070 electrically coupled to the anode (or emitter) of the SCR device 1001. The base resistor 1060 can have a resistance Zb of about 0Ω to about 200Ω. The emitter resistor 1070 can have a resistance Ze of about 0Ω to about 200Ω. A circuit equivalent to that of the protection device is shown in FIG. 10B.

During operation, a base current Ib is divided into a first base current $I_{b1}$ flowing to the base resistor 1060, and a second base current $I_{b2}$ flowing to the emitter resistor 1070. Further, the device 1000 can have an emitter current Ie. The SCR device 1000 can have a gain βn' that can be expressed as in Equations (3-1) to (3-3) below.

$$\beta'_n = \frac{I_e}{I_b} = \beta_n \frac{I_{b2}}{I_b} \quad \text{Equation (3-1)}$$

$$\beta'_n = \beta_n\left(1 - \frac{I_{b1}}{I_b}\right) \quad \text{Equation (3-2)}$$

$$\beta'_n \approx \beta_n\left(1 - \left(\frac{Z_e}{Z_b + Z_e}\right)\right) \quad \text{Equation (3-3)}$$

In Equations (3-1) to (3-3), βn is the gain of the NPN transistor 751 (FIG. 10B). If Zb is 0, βn' also approaches 0, and thus βn'×βp is smaller than 1. βp is the gain of the PNP transistor 752. In such a configuration, the SCR device 1000 can have a relatively high holding voltage. In contrast, if Ze is 0, βn' also approaches the value of βn, and thus βn'×βp is greater than 1. In such a configuration, the SCR device 1000 can have a relatively low holding voltage.

In configurations between the above two extreme configurations, the gain βn' varies, depending on a ratio of Zb to Ze. As Ze is increased to be greater than Zb, the holding voltage of the device 1000 can be increased. Table 1 below shows example resistance values of the emitter and base resistors 1070, 1060 and holding voltages $V_H$ at the respective values.

TABLE 1

| Ze (ohms) | Zb (ohms) | $V_H$ (volts) |
| --- | --- | --- |
| 3.2 | 37 | 90 |
| 20.8 | 37 | 125 |
| 89 | 37 | 145 |
| 125 | 37 | 240 |

Figure 10C:
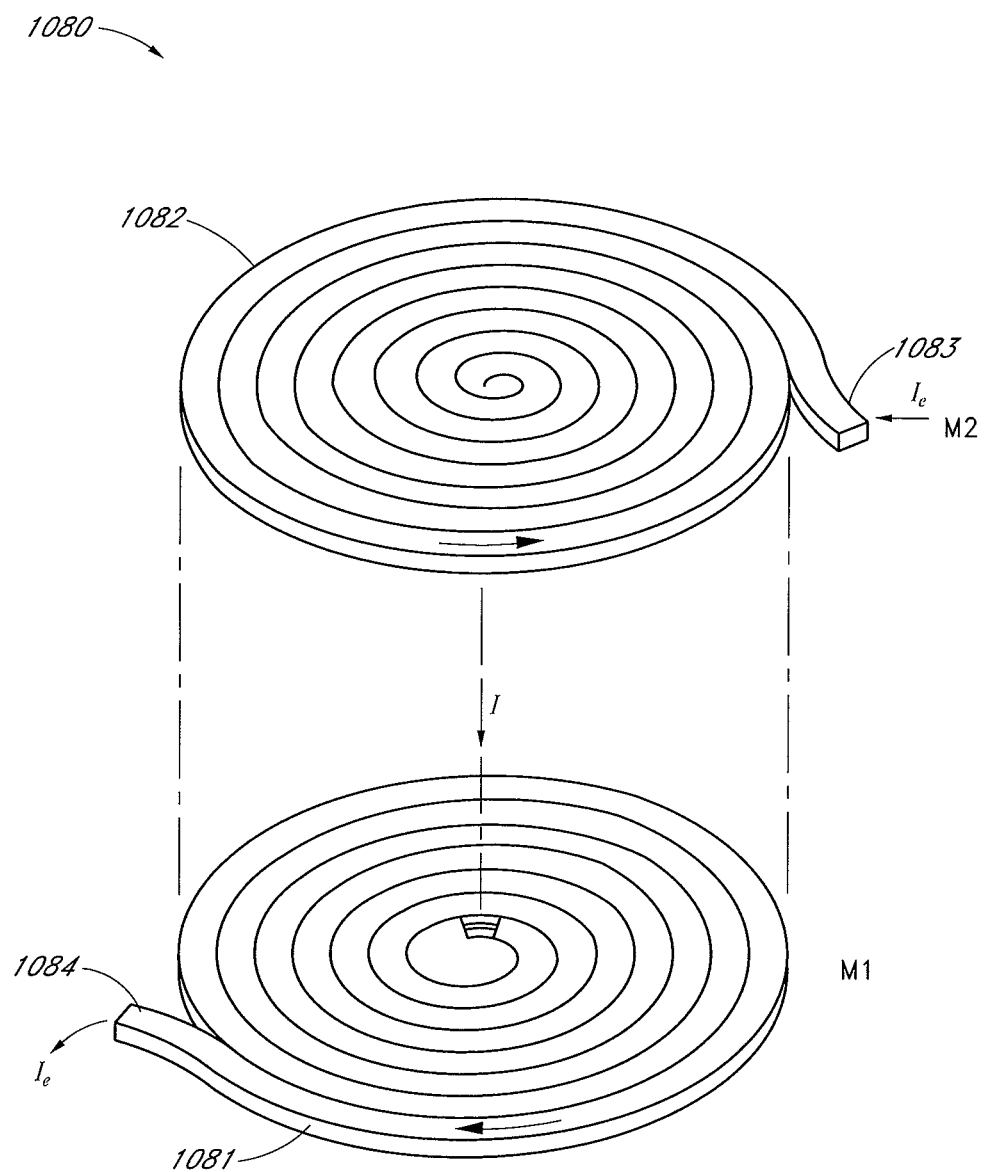
FIG. 10C is a schematic exploded perspective view of a resistor for use in the SCR ESD protection device of FIG. 10A according to one embodiment.

Referring to FIG. 10C, one embodiment of an impedance structure for use in providing the emitter resistance Ze of FIGS. 10A and 10B will be described below. In the illustrated embodiment, the impedance structure 1080 includes a first metallization coil 1081 and a second metallization coil 1082 overlying the first metallization coil 1081. The metallization coils 1081, 1082 are electrically coupled at the center although FIG. 10C, which is an exploded perspective view, shows them separated from each other.

The impedance structure 1080 is coupled to the device 1000 such that a first end is coupled to the second n+ region 722 to receive an emitter current Ie, and a second end serves to output the emitter current Ie. The first metallization coil 1081 spirals towards the center such that the emitter current Ie flows in the clockwise direction, and the second metallization coil 1082 spirals towards the center such that the emitter current Ie flows out in the anti-clockwise direction. This configuration cancels out inductances from the first and second metallization coils 1081, 1082 while providing a desired resistance value for the emitter resistor 1070. In one embodiment, the impedance structure 1080 can be formed of aluminum. The impedance structure 1080 is relatively insusceptible to ESD events. The impedance structure 1080 can be referred to as a counter current metal bifilar coil in the context of this document.

Figure 11A:
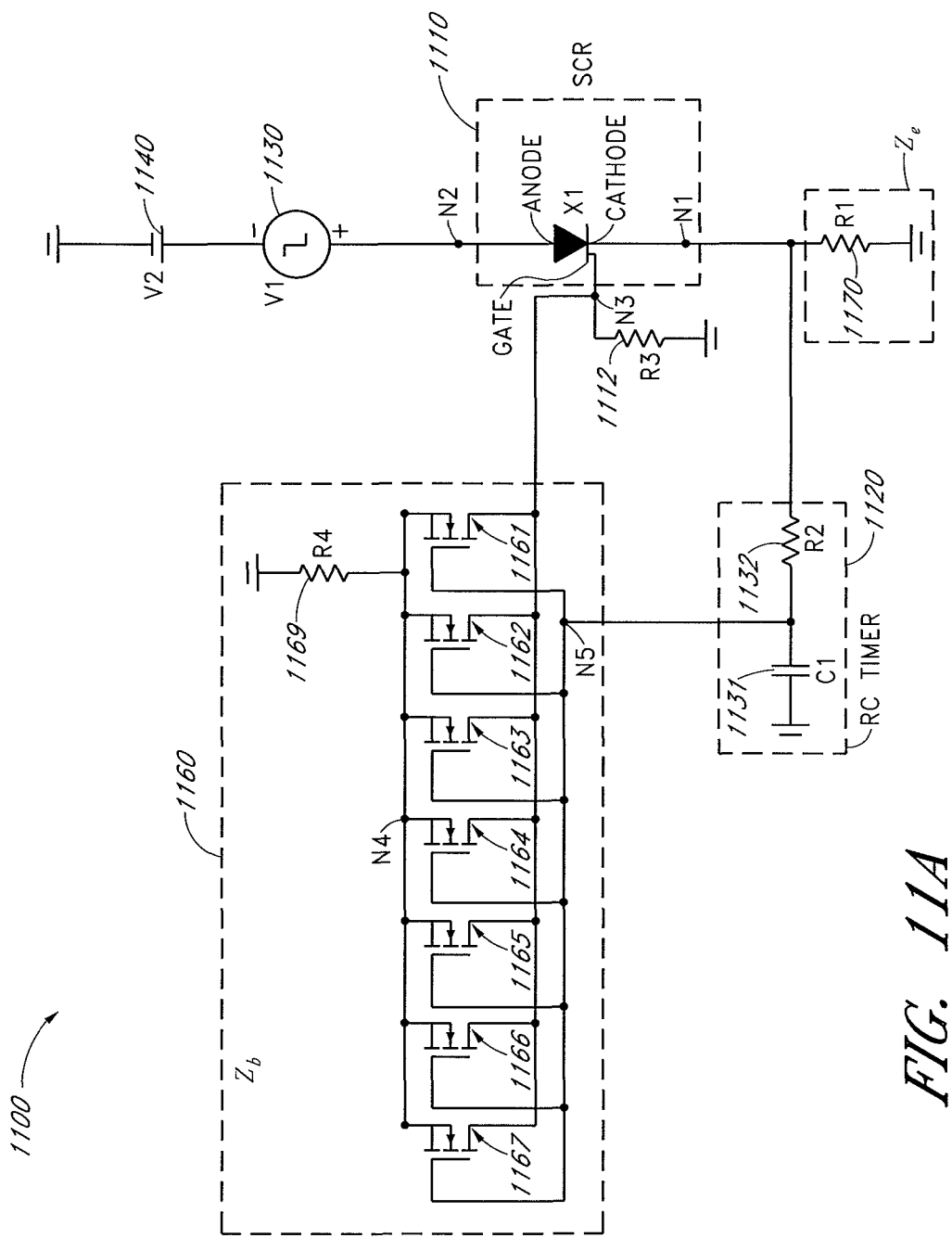
FIG. 11A is a circuit diagram of an SCR ESD protection device according to yet another embodiment.

Referring to FIG. 11A, an ESD protection device having a silicon-controlled rectifier (SCR) configuration according to yet another embodiment will be described below. The illustrated protection device 1100 includes a silicon-controlled rectifier (SCR) 1110, a gate resistor 1112, a timer 1120, a first voltage source 1130, a second voltage source 1140, a base impedance block 1160, an emitter impedance block 1170, and first to fifth nodes N1-N5.

The SCR 1110 can have an anode electrically coupled to the first voltage source 1130 via the second node N2, a cathode electrically coupled to the emitter impedance block 1170 via the first node N1, and a gate electrically coupled to the gate resistor 1112 via the third node N3. The cathode and anode of the SCR 1110 can be electrically coupled to first and second nodes, respectively, of an internal circuit to be protected. For example, the first and second nodes can be any two of the nodes 161, 162, 163, 164 of FIG. 1. For a symmetric SCR device, the anode and cathode are the same, and therefore the polarities of connections to the SCR device do not matter. However, for a non-symmetric SCR device, the SCR device should be correctly connected to voltages references, such as Vcc and Vee. Other details of the SCR 1110 can be as described above in connection with any one or more of FIG. 7A, 7B, 8A-8C, 9A, or 9B.

The gate resistor 1112 can have a first end coupled to the third node N3, and a second end coupled to a voltage reference, for example, ground. The gate resistor 1112 can have a resistance R3 of about 1 kΩ to about 30 kΩ, for example, 15 kΩ.

The timer 1120 serves to delay the switching on of the base impedance block 1160. The timer 1120 can be an RC timer, and can include a timer capacitor 1131, and a timer resistor 1132 coupled in series between the first node N1 and a voltage reference, for example ground. The timer capacitor 1131 and the timer resistor 1132 are coupled to each other at the fifth node N5. The timer capacitor 1131 can have a capacitance C1 of about 0 pF to about 100 pF, for example, 2 pF. The timer resistor 1132 can have a resistance R2 of about 0 MΩ to about 10 MΩ, for example, 2 MΩ.

The first voltage source 1130 includes a positive terminal coupled to the second node N2 and a negative terminal coupled to the second voltage source 1140. The second voltage source 1140 can have a positive terminal coupled to the negative terminal of the first voltage source 1130, and a negative terminal coupled to a voltage reference, such as ground.

The base impedance block 1160 serves to provide the base impedance, similar to the base resistor 1060 of FIGS. 10A and 10B. The base impedance block 1160, however, is turned on at a delayed time to provide impedance in response to the operation of the timer 1120. The base impedance block 1160 can include one or more transistors 1161-1167 and a base resistor 1169.

The transistors 1161-1167 are coupled in parallel to one another between the third node N3 and the fourth node N4. In the illustrated embodiment, seven transistors are included in the base impedance block 1160, but the number of transistors can vary widely, depending on the impedance to be provided by the base impedance block 1160. Each of the transistors 1161-1167 can be an NMOS transistor having a source coupled to the fourth node N4, a drain coupled to the third node N3, and a gate coupled to the fifth node N5. In other embodiments, the base impedance block 1160 can be modified to include one or more PMOS transistors or NPN or PNP bipolar transistors in place of the NMOS transistors 1161-1167. The base resistor 1169 has a first end coupled to the fourth node N4 and a second end coupled to a voltage reference, for example, ground.

The emitter impedance block 1170 can include an emitter resistor. The emitter resistor can provide a resistance similar to that of the emitter resistor 1070 of FIGS. 10A and 10B. The emitter resistor 1170 can have a resistance R1 of about 0Ω to about 200Ω, for example, 9Ω. In one embodiment, the emitter resistor can have the structure shown in FIG. 10C.

During operation, when an ESD event occurs, the timer 1120 delays turning on the transistors 1161-1167 during a period of time substantially equal to the time constant τ of the timer 1120. The time constant τ can be equal to R2×C1. During the period of time substantially equal to the time constant, the base impedance Zb is substantially greater than the emitter impedance Ze. Thus, the gain βn' of the device 1100 approaches the gain βn of the NPN transistor of the SCR 1110.

After the period, the transistors 1161-1167 are turned on, thereby substantially reducing the base impedance Zb. Thus, the base impedance Zb is substantially smaller than the emitter impedance Ze. Thus, the gain βn' of the device 1100 approaches 0. Thus, the holding voltage of the device 1100 can be lowered by the operation of the timer 1120.

Figure 11B:
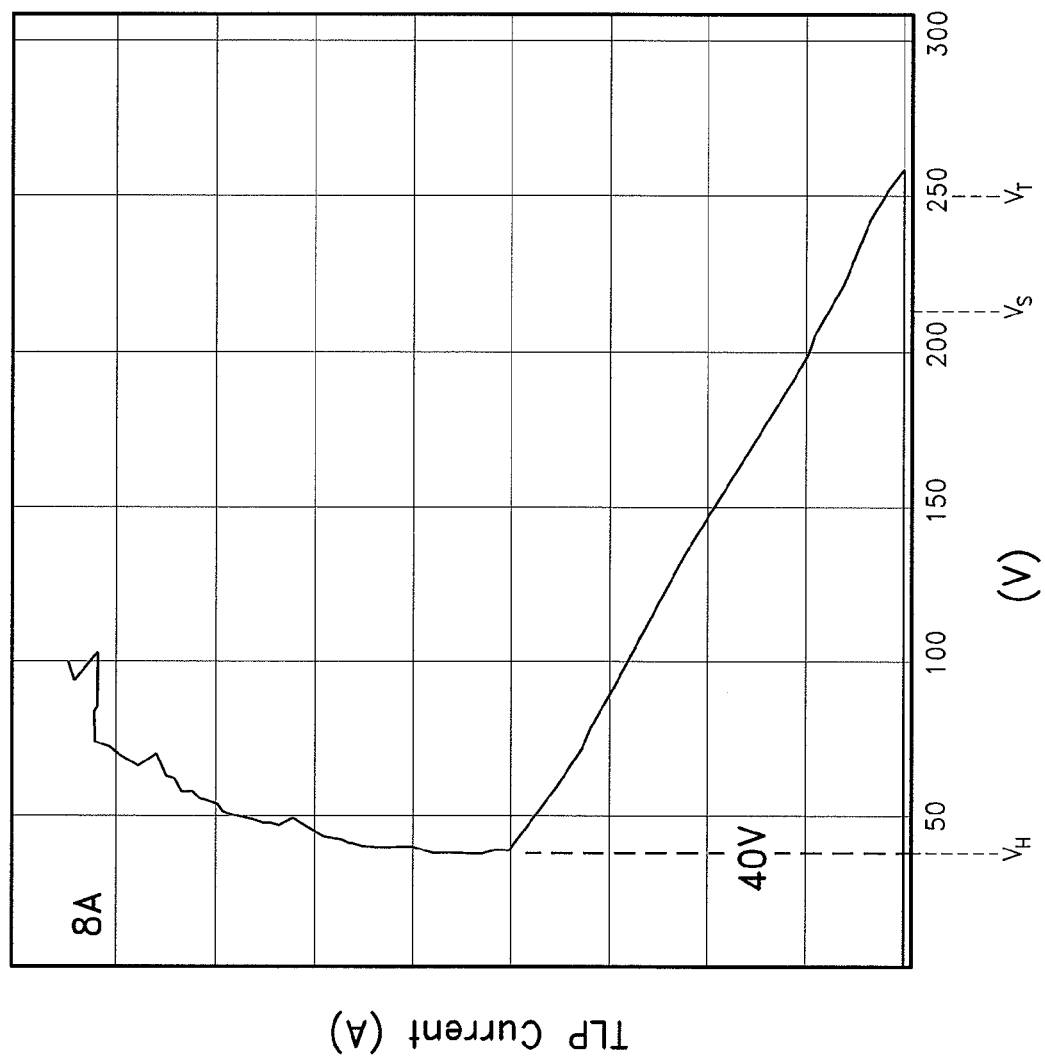
FIG. 11B is a graph illustrating a relationship between output current and input voltage of the ESD protection device of FIG. 11A.

FIG. 11B shows a relationship between the TLP voltage and TLP current of the device 1100. In FIG. 11B, the trigger voltage is about 250 V, but the holding voltage is relatively lower, and is about 40 V.

Figure 12:
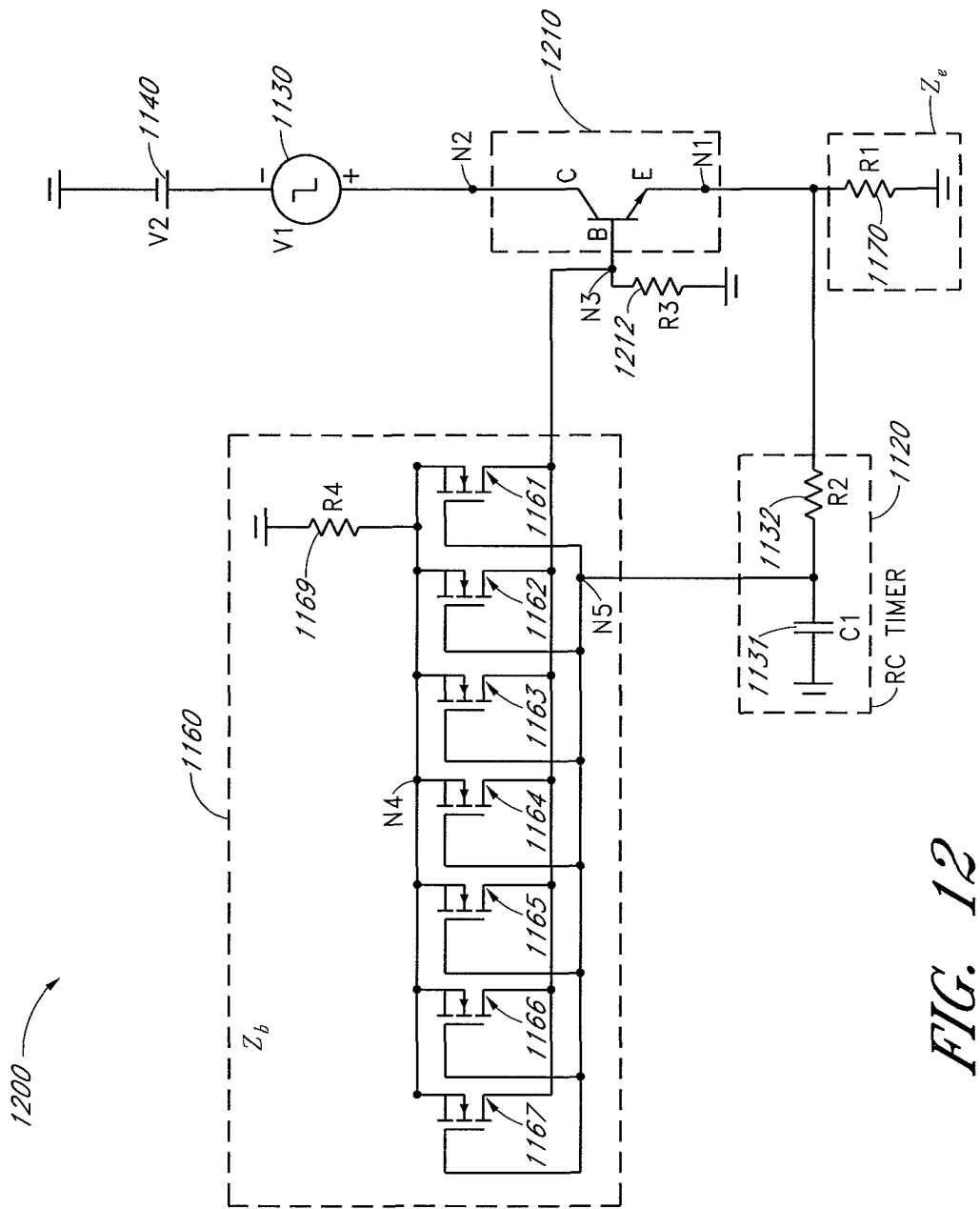
FIG. 12 is a circuit diagram of a bipolar ESD protection device according to yet another embodiment.

Referring to FIG. 12, an ESD protection device having a bipolar device configuration according to yet another embodiment will be described below. The illustrated protection device 1200 includes a bipolar transistor 1210, a base resistor 1212, a timer 1120, a first voltage source 1130, a second voltage source 1140, a base impedance block 1160, an emitter impedance block 1170, and first to fifth nodes N1-N5.

The bipolar transistor 1210 can have a collector electrically coupled to the first voltage source 1130 via the second node N2, an emitter electrically coupled to the emitter impedance block 1170 via the first node N1, and a base electrically coupled to the base resistor 1212 via the third node N3. The collector and emitter of the bipolar transistor 1210 can be electrically coupled to first and second nodes, respectively, of an internal circuit to be protected. For example, the first and second nodes can be any two of the nodes 161, 162, 163, 164 of FIG. 1. The illustrated bipolar transistor 1210 is a non-symmetric device, and therefore its collector should be connected to the second node N2, and its emitter should be connected to the first node N1. Other details of the bipolar transistor 1210 can be as described above in connection with any one or more of FIGS. 4A and 4B, 5A and 5B, 5C, 5D, or 5E.

The base resistor 1212 can have a first end coupled to the third node N3, and a second end coupled to a voltage reference, for example, ground. The base resistor 1212 can have a resistance R3 of about 1 kΩ to about 30 kΩ for example, 15 kΩ. The configurations of the timer 1120, the first voltage source 1130, the second voltage source 1140, the base impedance block 1160, the emitter impedance block 1170 can be as described above in connection with those shown in FIG. 11A.

During operation, when an ESD event occurs, the timer 1120 delays turning on the transistors 1161-1167 in the base impedance block 1160 during a period of time substantially equal to the time constant τ of the timer 1120. The time constant τ can be equal to R2×C1. During the period of time substantially equal to the time constant, the transistors 1161-1167 are turned on, thereby substantially reducing the base impedance Zb. Thus, the base impedance Zb is substantially smaller than the emitter impedance Ze. Thus, the gain of the device 1200 approaches, and thus, the holding voltage of the device 1200 can be lowered by the operation of the timer 1120.

In some embodiments, two or more of the embodiments described above in connection with FIGS. 4A and 4B, 5A and 5B, 5C, 5D, 5E, 7A-7C, 8A-8C, 9A, 9B, 10A-10C, 11A, and 12 can be combined to form one or more ESD devices to cover a wide range of voltage, as shown in FIG. 3.

In all the embodiments described above, the protection devices can include layers, regions, and wells having either n-type or p-type dopants. In other embodiments, the doping types of all the layers, regions, and wells of the protection devices can be opposite to those described and shown in the above embodiments, and the same principles and advantages can still apply to the other embodiments. In addition, swapping p and n for diodes reverses the anode and cathode of a diode, such as those of the diode array 802 (FIG. 8C).

Applications

Thus, a skilled artisan will appreciate that the configurations and principles of the embodiments can be adapted for any devices that can be protected from over- or under-voltage conditions by the ESD protection devices described above. The ESD protection devices employing the above described configurations can be implemented into various electronic devices or integrated circuits. Examples of the electronic devices can include, but are not limited to, consumer electronic products, parts of the consumer electronic products, electronic test equipments, etc. Examples of the electronic devices can also include circuits of optical networks or other communication networks, and disk driver circuits. The consumer electronic products can include, but are not limited to, a mobile phone, cellular base stations, a telephone, a television, a computer monitor, a computer, a hand-held computer, a netbook, a tablet computer, a digital book, a personal digital assistant (PDA), a stereo system, a cassette recorder or player, a DVD player, a CD player, a VCR, a DVR, an MP3 player, a radio, a camcorder, a camera, a digital camera, a portable memory chip, a copier, a facsimile machine, a scanner, a multi functional peripheral device, a wrist watch, a clock, etc. Further, the electronic device can include unfinished products.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
an internal circuit electrically coupled between a first node and a second node; and
a protection device electrically coupled between the first node and the second node, wherein the protection device is configured to protect the internal circuit from transient electrical events, the protection device comprising:
a silicon-controlled rectifier (SCR) having an anode, a gate, and a cathode, wherein the anode is electrically coupled to the first node, and the cathode is electrically coupled to the second node,
wherein the SCR comprises:
a substrate having a doping of a first type;
a first well disposed in a first upper portion of the substrate, and having a doping of a second type different from the first type;
a second well disposed in a second upper portion of the substrate, and spaced apart laterally from the first well such that a third upper portion of the substrate is laterally interposed between the first and second wells, the second well having a doping of the second type, the third upper portion having a doping of the first type;
a first region disposed in a top portion of the first well, and having a doping of the second type with a higher doping concentration than that of the first well, the first region being electrically coupled to the second node;
a second region disposed in a top portion of the second well, and having a doping of the second type with a higher doping concentration than that of the second well;
a third region disposed in the first well adjacent to the first region such that the third region is interposed laterally between the first region and the third upper portion of the substrate, the third region having a doping of the first type with a higher doping concentration than that of the substrate;
a fourth region disposed in the second well adjacent to the second region such that the fourth region is interposed laterally between the second region and the third upper portion of the substrate, the fourth region having a doping of the first type with a higher doping concentration than that of the substrate, the fourth region being electrically coupled to the first node; and
a gate contact disposed on the third upper portion of the substrate.

2. The apparatus of claim 1, wherein the SCR comprises:
a PNP bipolar transistor having an emitter, a base, and a collector, wherein the emitter of the PNP bipolar transistor is electrically coupled to the first node, wherein the collector of the PNP bipolar transistor forms the gate of the SCR; and
an NPN bipolar transistor having an emitter, a base, and a collector, wherein the emitter of the NPN bipolar transistor is electrically coupled to the second node, wherein the base of the NPN bipolar transistor is electrically coupled to the collector of the PNP bipolar transistor, wherein the collector of the NPN bipolar transistor is electrically coupled to the base of the PNP bipolar transistor.

3. The apparatus of claim 1, further comprising:
a diode array comprising a plurality of diodes connected in series between the gate and the anode of the silicon-controlled rectifier and arranged such that the diodes conduct a current into the SCR to turn on the SCR when the diodes break down.

4. The apparatus of claim 1, the protection device further comprising: a resistor electrically coupled between the gate and the cathode of the SCR.

5. The apparatus of claim 1, wherein the third region has a lateral dimension extending in a direction from the first region toward the third upper portion of the substrate, wherein the lateral dimension of the third region is greater than the lateral dimension of the first region in the direction.

6. The apparatus of claim 5, wherein the fourth region has a lateral dimension extending in the direction, wherein the lateral dimension of the fourth region is greater than the lateral dimension of the second region in the direction.

7. The apparatus of claim 1, the protection device further comprising:
a first resistor electrically coupled between the cathode of the SCR and the second node; and
a second resistor electrically coupled to the gate of the SCR.

8. The apparatus of claim 7, wherein the first resistor comprises:
a first coil having a first end electrically coupled to the cathode of the SCR, wherein the first coil spirals towards the center of the first coil in one of clockwise or anti-clockwise direction; and
a second coil underlying the first coil and having a second end electrically coupled to the second node, wherein the second coil spirals towards the center of the second coil in the other of clockwise or anti-clockwise direction, wherein the centers of the first and second coils are electrically coupled to each other.

9. The apparatus of claim 1, wherein:

the SCR comprises a bipolar device having a first terminal configured to serve as the anode, a second terminal configured to serve as the gate, and a third terminal configured to serve as the cathode, and the protection device further comprises:

an impedance block electrically coupled between the second terminal of the bipolar device and a first voltage reference, wherein the impedance block is configured to have a varying impedance; and an impedance control circuit configured to vary the impedance of the impedance block.

10. The apparatus of claim 9, wherein the impedance block comprises a plurality of transistors electrically coupled in parallel to one another, and coupled between the second terminal of the bipolar device and the first voltage reference.

11. The apparatus of claim 10, wherein the impedance control circuit comprises a timer circuit configured to delay a decrease in the impedance of the impedance block upon an occurrence of an overvoltage condition between the first node and the second node.

12. The apparatus of claim 11, wherein the timer circuit comprises:

a timer capacitor electrically coupled between a second voltage reference and a timer node; and a timer resistor electrically coupled between the timer node and the third terminal of the bipolar device, wherein the timer node is electrically coupled to the impedance block.

13. The apparatus of claim 12, wherein the plurality of transistors comprise MOS transistors, each of the MOS transistors having a gate, and wherein the timer node is electrically coupled to the gates of the MOS transistors.

14. The apparatus of claim 13, wherein the timer circuit is configured to delay turning on the MOS transistors by a time constant that is substantially equal to the capacitance of the timer capacitor times the resistance of the timer resistor.

15. The apparatus of claim 9, further comprising a first resistor electrically coupled between the third terminal of the bipolar device and a third voltage reference.

16. The apparatus of claim 15, further comprising:

a second resistor electrically coupled between the second terminal of the bipolar device and ground; and a voltage source electrically coupled to the first terminal of the bipolar device.

\* \* \* \* \*